(12) United States Patent
Hase

(10) Patent No.: US 11,964,575 B2
(45) Date of Patent: Apr. 23, 2024

(54) CONTROL APPARATUS

(71) Applicant: DENSO CORPORATION, Kariya (JP)

(72) Inventor: Tomomi Hase, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/511,011

(22) Filed: Oct. 26, 2021

(65) Prior Publication Data
US 2022/0041071 A1 Feb. 10, 2022

Related U.S. Application Data

(63) Continuation of application No. 16/358,248, filed on Mar. 19, 2019, now Pat. No. 11,186,186.

(30) Foreign Application Priority Data

Mar. 22, 2018 (JP) .................................. 2018-054751

(51) Int. Cl.
*B60L 53/12* (2019.01)
*B60L 58/13* (2019.01)
(Continued)

(52) U.S. Cl.
CPC ............. *B60L 53/12* (2019.02); *B60L 58/13* (2019.02); *G01R 31/382* (2019.01);
(Continued)

(58) Field of Classification Search
CPC .......... B60L 53/12; B60L 53/32; B60L 58/13; B60L 50/10; H02J 7/025; H02J 7/042;
(Continued)

(56) References Cited

U.S. PATENT DOCUMENTS 9,643,512 B2 * 5/2017 Soo .................... B60L 1/006
9,685,810 B1 * 6/2017 Bhardwaj ............ H02J 7/0048
(Continued)

FOREIGN PATENT DOCUMENTS

JP  2001-325994 A  11/2001
JP  2007-060854 A  3/2007
(Continued)

OTHER PUBLICATIONS

Apr. 29, 2021 Office Action issued in U.S. Appl. No. 16/358,248.
(Continued)

*Primary Examiner* — Edward Tso
*Assistant Examiner* — Aaron Piggush
(74) *Attorney, Agent, or Firm* — Oliff PLC

(57) ABSTRACT

A control apparatus is used for an electric electric vehicle. The electric vehicle charges a storage battery with electric power that is supplied while traveling in a power supply lane that is a travelling road on which contactless power supply is able to be performed. The control apparatus for the electric vehicle includes a charging control unit and a range changing unit. The charging control unit controls charging of a storage battery of an electric vehicle such that a charge amount of the storage battery falls within a target range that is a preset range. The range changing unit changes at least one of an upper limit value and a lower limit value of the target range based on a state of the electric vehicle.

7 Claims, 17 Drawing Sheets

(51) Int. Cl.
*G01R 31/382* (2019.01)
*H01M 10/44* (2006.01)
*H02J 7/00* (2006.01)
*H02J 50/10* (2016.01)
*B60L 53/30* (2019.01)

(52) U.S. Cl.
CPC ....... *H01M 10/443* (2013.01); *H02J 7/00302* (2020.01); *H02J 50/10* (2016.02); *B60L 53/32* (2019.02); *H02J 2310/48* (2020.01); *Y02T 90/12* (2013.01)

(58) Field of Classification Search
CPC .......................... H02J 7/00302; H02J 2310/48; G01R 31/382; H01M 10/443; Y02T 90/12
USPC .......................... 320/104, 108, 109, 134, 138
See application file for complete search history.

(56) References Cited

U.S. PATENT DOCUMENTS

| | | | | |
|---|---|---|---|---|
| 11,186,186 B2* | 11/2021 | Hase | ............... | H02J 50/10 |
| 2010/0102776 A1* | 4/2010 | Uchida | ............... | B60K 6/445 |
| | | | | 320/109 |
| 2010/0131139 A1 | 5/2010 | Sakai et al. | | |
| 2011/0175576 A1 | 7/2011 | Uesaka et al. | | |
| 2011/0184842 A1* | 7/2011 | Melen | ............... | B60L 53/39 |
| | | | | 320/108 |
| 2014/0042968 A1* | 2/2014 | Hiroe | ............... | H02J 7/04 |
| | | | | 320/109 |
| 2015/0105948 A1* | 4/2015 | Chang | ............... | B60L 15/20 |
| | | | | 701/22 |
| 2015/0134174 A1* | 5/2015 | Preece | ............... | H01M 10/44 |
| | | | | 701/22 |
| 2017/0028981 A1* | 2/2017 | Ogawa | ............... | B60K 6/445 |
| 2017/0355358 A1 | 12/2017 | Ogawa et al. | | |
| 2019/0039467 A1 | 2/2019 | Hortop et al. | | |
| 2019/0291596 A1 | 9/2019 | Hase | | |

FOREIGN PATENT DOCUMENTS

| | | |
|---|---|---|
| JP | 2009-273198 A | 11/2009 |
| JP | 2014-202643 A | 10/2014 |
| JP | 2017-114312 A | 6/2017 |
| JP | 2018-186630 A | 11/2018 |
| WO | 2010-041312 A1 | 4/2010 |

OTHER PUBLICATIONS

Aug. 2, 2021, Notice of Allowance isssued in U.S. Appl. No. 16/358,248.

Jan. 7, 2021 Office Action issued in U.S. Appl. No. 16/358,248.

* cited by examiner

CONTROL APPARATUS

CROSS-REFERENCE TO RELATED APPLICATION

This application is a continuation of U.S. application Ser. No. 16/358,248 filed Mar. 19, 2019, which is based on and claims the benefit of priority from Japanese Patent Application No. 2018-054751, filed Mar. 22, 2018. The entire disclosures of the above applications are incorporated herein by reference.

BACKGROUND

Technical Field

The present disclosure relates to a control apparatus for an electric vehicle.

Related Art

An electric vehicle travels using a drive force from a rotating electric machine that is is driven by electric power stored in a storage battery. For example, such electric vehicles include electric vehicles that travel by only the drive force from the rotating electric machine, and hybrid vehicles that travel by the drive force from the rotating electric machine and a drive force from an internal combustion engine.

SUMMARY

The present disclosure provides a control apparatus for an electric vehicle. The electric vehicle is configured to charge a storage battery with electric power that is supplied while travelling in a power supply lane that is a travelling road on which contactless power supply can be performed. The control apparatus controls charging of the storage battery such that a charge amount of the storage battery falls within a target range that is a preset range. The control apparatus changes at least one of an upper limit value and a lower limit value of the target range based on a state of the electric vehicle.

DESCRIPTION OF THE EMBODIMENTS

Figure 1:
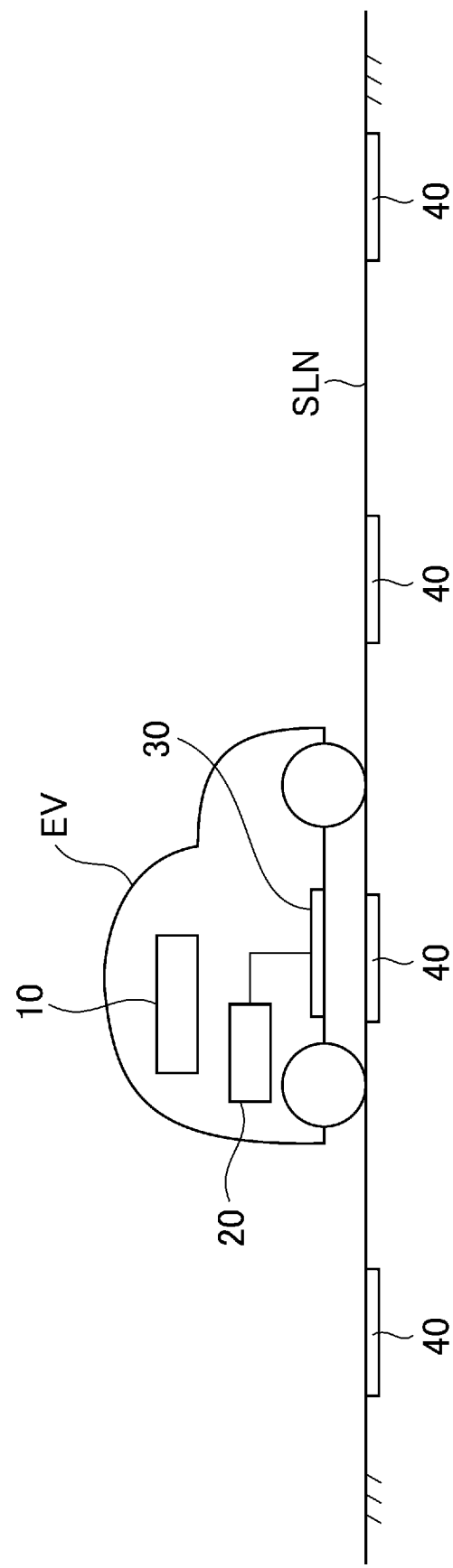
FIG. 1 is a diagram schematically showing an electric vehicle in which a control apparatus according to a first embodiment is mounted.

The electric vehicle is generally charged in a state in which the electric vehicle and a charging stand are connected by a cable. However, contactless charging of the electric vehicle through use of electromagnetic induction and magnetic resonance has also been studied in recent years. Moreover, contactless charging of the electric vehicle that is travelling in a traffic lane (on a travelling road) in which a plurality of coils for transmission of electric power are embedded is also being examined. It is thought that such traffic lanes (also referred to, hereafter, as power supply lanes) that are capable of supplying electric power in the foregoing manner to electric vehicles that are moving in these traffic lanes will be gradually installed in accompaniment with the future popularization of electric vehicles.

Here, the storage battery tends to degrade at an early stage when the storage battery is in a fully charged state over an extended period of time. Therefore, when the power supply lanes are set up in various locations and the electric vehicle frequently travels in the power supply lanes, the storage battery of the electric vehicle may be kept in a state that is close to fully charged at all times. Consequently, the storage battery may degrade at an early stage and be unable to sufficiently achieve charging and discharging performance thereof.

It is thus desired to provide a control apparatus for an electric vehicle that is capable of suppressing degradation of a storage battery.

An exemplary embodiment provides a control apparatus for an electric vehicle. The electric vehicle is configured to charge a storage battery with electric power that is supplied while travelling in a power supply lane that is a travelling road on which contactless power supply can be performed. The control apparatus includes: a charging control unit that controls charging of the storage battery such that a charge amount of the storage battery falls within a target range that is a preset range; and a range changing unit that changes at least one of an upper limit value and a lower limit value of the target range based on a state of the electric vehicle.

In the control apparatus, the charge amount of the storage battery when charging is performed is adjusted such that the charge amount falls within the preset target range. The upper limit value and the lower limit value of the target range are changed as appropriate based on the state of the electric vehicle, rather than being fixed at all times.

Therefore, for example, when charging is performed while the electric vehicle is traveling, charging can be stopped at an early stage by the upper limit value being set to a lower value. Degradation of the storage battery caused by the storage battery being kept fully charged can be prevented. In addition, when the distance to a next power supply location is long, the storage battery can be charged to a state that is close to fully charged by the upper limit value being set to a higher value. A situation in which electric power becomes insufficient midway on the travelling road can be prevented.

The exemplary embodiment provides a control apparatus that is capable of suppressing degradation of a storage battery.

Embodiments will hereinafter be described with reference to the accompanying drawings. To facilitate understanding of the descriptions, constituent elements in the drawings that are identical to each other are given the same reference numbers when possible.

Redundant descriptions are omitted.

First Embodiment

A first embodiment will be described. As shown in FIG. 1, a control apparatus 10 according to the present embodiment is mounted in an electric vehicle EV. The control apparatus 10 is configured to control travelling, charging, and the like of the electric vehicle EV.

First, the electric vehicle EV will be described. The electric vehicle EV includes a storage battery 20 and a motor generator 21 (not shown in FIG. 1; see FIG. 2). The storage battery 20 is an onboard battery that stores electric power. For example, the storage battery 20 is a lithium ion battery. The motor generator 21 is a rotating electric machine that generates a drive force of the electric vehicle EV. The motor generator 21 generates the drive force by electric power supplied from the storage battery 20. In addition, the motor generator 21 is capable of generating electric power using energy during deceleration of the electric vehicle EV. The motor generator 21 is then able to charge the storage battery 20 by supplying the generated electric power to the storage battery 20. That is, the motor generator 21 can also generate regenerative electric power and charge the storage battery 20 with the generated regenerative electric power.

In this manner, the electric vehicle EV is configured as an electric vehicle that moves using only the drive force from the motor generator 21. Instead of a mode such as that described above, the electric vehicle EV may be configured as a hybrid vehicle that travels using both the drive force from the rotating electric machine and a drive force from an internal combustion engine.

The electric vehicle EV is capable of charging the storage battery 20 with electric power by receiving shared electric power from an external source without contact while traveling in a traffic lane (on a travelling road). To implement this manner of charging, a power reception coil 30 is provided in a bottom surface portion of the electric vehicle EV. In addition, a plurality of power transmission coils 40 are provided in a power supply lane SLN that is a travelling road on which contactless power supply is possible. As shown in FIG. 1, the plurality of power transmission coils 40 are arranged in a row at a predetermined interval along a direction in which the electric vehicle EV is traveling. The power supply lane SLN such as this is provided in some sections of the travelling road on which the electric vehicle EV is traveling.

Figure 2:
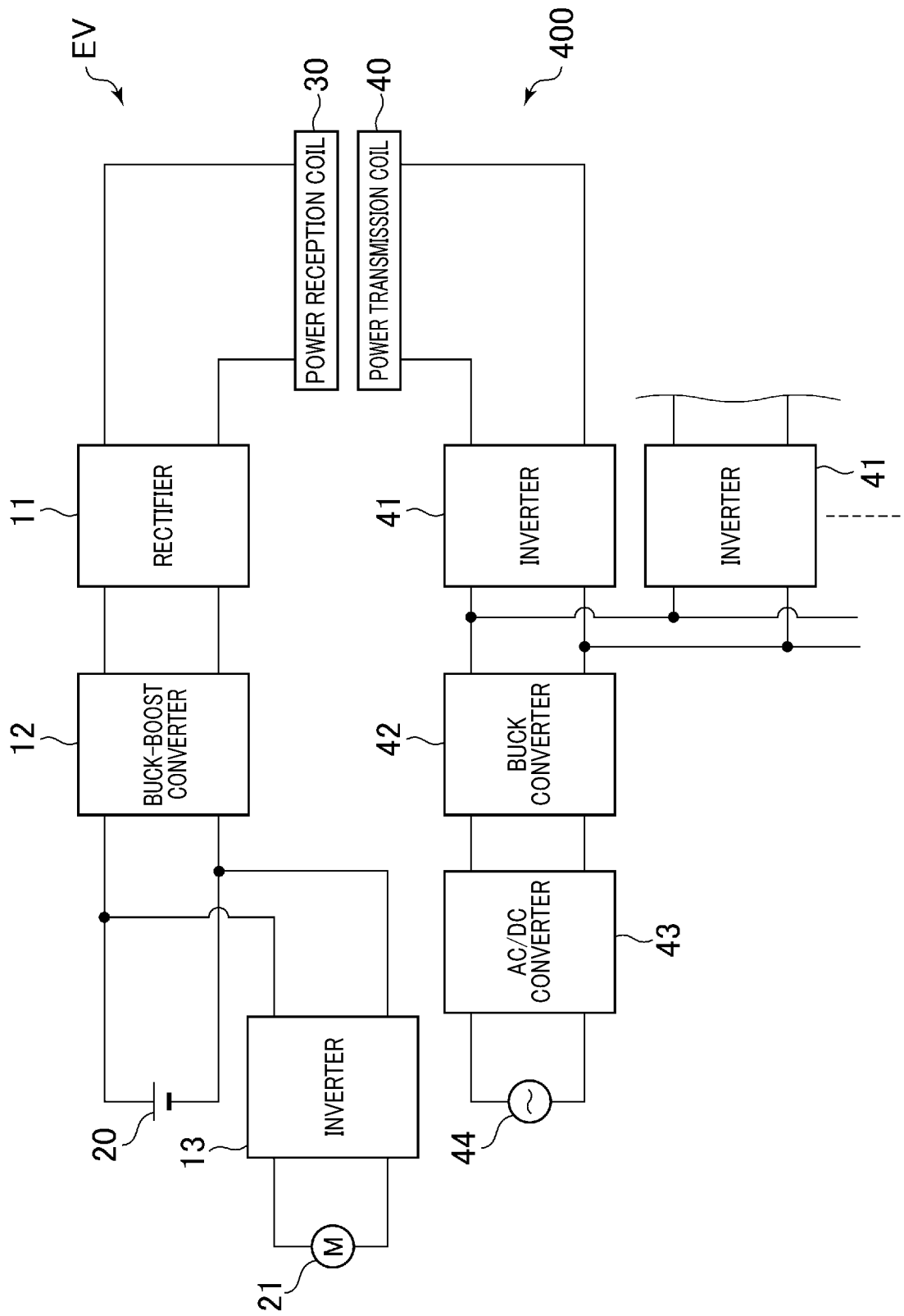
FIG. 2 is a diagram schematically showing a configuration of the electric vehicle and a configuration of a contactless power supply apparatus that is arranged in a power supply lane, according to the first embodiment.

A configuration for implementing contactless power supply will be described with reference to FIG. 2. In FIG. 2, an upper portion shows the power reception coil 30, a rectifier 11, a buck-boost converter (step-up/step-down converter) 12, the storage battery 20, the motor generator 21, and an inverter 13. In FIG. 2, a lower portion shows the transmission coils 40, an inverter 41, a buck converter 42, an alternating-current to direct-current (AC/DC) converter 43, and a power supply 44 that are provided in the power supply lane SLN. An overall apparatus that is configured by the above-described components provided in the power supply lane SLN is also referred to, hereafter, as a "contactless power supply apparatus 400."

First, the configuration on the electric vehicle EV side will be described. As described above, the power reception coil 30 is a coil that is provided in the bottom surface portion of the electric vehicle EV. The power reception coil 30 receives electric power supplied from the power transmission coils 40, described hereafter, without contact. The power reception coil 30 is provided in a state in which a center axis of the power reception coil 30 is aligned with a vertical direction.

When the power reception coil 30 is directly above the power transmission coil 40, the power transmission coil 40 is in a state in which an alternating current is flowing. At this time, the alternating-current also flows to the power reception coil 30 as a result of so-called magnetic resonance. That is, electric power is supplied from the power transmission coil 40 to the power reception coil 30 without contact. Here, a mode in which contactless power supply is performed by electromagnetic induction instead of magnetic resonance such as that described above is also possible.

The rectifier 11 is a power converter that converts alternating-current power from the power reception coil 30 to direct-current power. The electric power that has been converted to direct-current power by the rectifier 11 is supplied to the buck-boost converter 12.

The buck-boost converter 12 is a power converter that steps up or steps down the voltage of the electric power from the rectifier 11. The direct-current power of which the voltage has been stepped up or stepped down by the buck-boost converter 12 is supplied to the storage battery 20 and the storage battery 20 is charged. The control apparatus 10, described hereafter, controls the operations of the rectifier 11 and the buck-boost converter 12 such as those described above. As a result, charging of the storage battery 20 is appropriately controlled.

The inverter 13 is a power converter that converts direct-current power supplied from the storage battery 20 to alternating-current power. The inverter 13 then supplies the motor generator 21 with the alternating-current power. The inverter 13 adjusts the magnitude of the electric power supplied to the motor generator 21 and thereby adjusts the drive force. The control apparatus 10 controls the operations of the inverter 13. As shown in FIG. 2, a power line that extends from the inverter 13 is connected to a position between the storage battery 20 and the buck-boost converter 12.

Next, the configuration on the contactless power supply apparatus 400 side will be described. The power supply 44 is an alternating-current power supply that serves as a supply source of electric power that is supplied to the electric vehicle EV from the power transmission coils 40. For example, a system power supply is used as the power supply 44.

The AC/DC converter 43 is a power converter that temporarily converts the alternating-current power from the power supply 44 to direct-current power. The electric power that has been converted to direct-current power by the AC/DC converter 43 is supplied to the buck converter 42.

The buck converter 42 is a power converter that steps down the voltage of the electric power from the AC/DC converter 43. The direct-current power of which the voltage has been stepped down by the buck converter 42 is supplied to the inverter 41. The inverter 41 is a power converter that converts the direct-current power from the buck converter 42 to alternating-current power again. A plurality of inverters 41 are provided so as to correspond to the transmission coils 40. The inverters 41 are connected to the buck converter 42 such that the inverters 40 are parallel to one another.

The alternating-current power from the inverter 41 is supplied to the power transmission coil 40. As described above, electric power is supplied to the electric vehicle EV via the power reception coil 30 and the storage battery 20 is thereby charged. In a manner similar to the power reception coil 30, the power transmission coil 40 is provided in a state in which the center axis of the power transmission coil 40 is aligned with the vertical direction.

A power supply control apparatus 45 (see FIG. 3), described hereafter, controls the operations of the contactless power supply apparatus 400, that is, the respective operations of the AC/DC converter 43, the buck converter 42, and the inverters 41. As a result, the magnitude of the electric power outputted from the power transmission coils 40 can be appropriately adjusted.

The configurations of the electric vehicle EV and the contactless power supply apparatus 400 will be further described with reference to FIG. 3. In addition to the storage battery 20 and the like described above, the electric vehicle EV also includes an onboard camera 151, a braking apparatus 152, a steering apparatus 153, a drive apparatus 154, a communication apparatus 155, and a control apparatus 10. The electric vehicle EV according to the present embodiment is configured as an autonomous vehicle that is capable of automatically traveling without being controlled using manual operations by a driver. Such a configuration is merely an example. The electric vehicle EV may be a vehicle that travels based on manual operations by a driver.

The onboard camera 151 captures images of the periphery of the electric vehicle EV, particularly the area ahead of the electric vehicle EV. For example, the onboard camera 151 is a camera that uses a complementary metal-oxide semiconductor (CMOS) sensor. The onboard camera 151 transmits data of the captured image to the control apparatus 10. The control apparatus 10 is capable of detecting the positions of obstacles and traffic lanes in the periphery of the electric vehicle EV and the like by analyzing the image. As a result, steering and braking to avoid a collision with an obstacle, steering to implement traveling along a traffic lane, and the like can be automatically performed. In addition, the control apparatus 10 is capable of detecting the presence, the position, and the like of the power supply lane SNL that is present ahead, based on the image captured by the onboard camera 151. Furthermore, the control apparatus 10 is also capable of detecting a speed limit and the like of the travelling road on which the electric vehicle EV is traveling.

The braking apparatus 152 generates braking force using electric power, and decelerates or stops the electric vehicle EV using the generated braking force. The braking apparatus 152 can fully generate the braking force that is required for deceleration and the like without being based on an operation of a brake pedal by the driver. The control apparatus 10 controls the operations of the braking apparatus 152.

The steering apparatus 153 performs steering of the electric vehicle EV by applying steering force generated by electric power to a steering shaft. The steering apparatus 153 is capable of fully generating the steering force that is required for the electric vehicle EV to travel along a traffic lane without being based on steering operations by the driver. The control apparatus 10 controls the operations of the steering apparatus 153.

The drive apparatus 154 controls the drive force of the electric vehicle EV. In FIG. 3, the drive apparatus 154 and the motor generator 21 are shown to be separate blocks. However, the motor generator 21, together with the inverter 13 shown in FIG. 2, is a part of the drive apparatus 154. The control apparatus 10 controls the operations of the drive apparatus 154. The control apparatus 10 is capable of adjusting a traveling speed of the electric vehicle EV by controlling the respective operations of the drive apparatus 154 and the braking apparatus 152.

The communication apparatus 155 performs wireless communication with external parties. The control apparatus 10 can communicate with another vehicle that is traveling in the periphery, and communicate with a management system (such as the power supply control apparatus 45) that manages the road and the like, through the communication apparatus 155.

The control apparatus 10 controls traveling, charging, and the like of the electric vehicle EV. The control apparatus 10 is configured as a computer system that includes a central processing unit (CPU), a read-only memory (ROM), a random access memory (RAM), and the like. As a functional control block, the control apparatus 10 includes a traveling control unit 110, a charging control unit 120, and a range changing unit 130.

The traveling control unit 110 implements automated driving by the electric vehicle EV by controlling the respective operations of the braking apparatus 152, the steering apparatus 153, and the drive apparatus 154.

The charging control unit 120 controls charging of the storage battery 20 such that a charge amount in the storage battery 20 falls within a target range that is preset. The charging control apparatus 120 charges the storage battery 20 by controlling the operations of the rectifier 11, the buck-boost converter 12, and the like. The charging control apparatus 120 thereby adjusts the charge amount of the storage battery 20.

Figure 4:
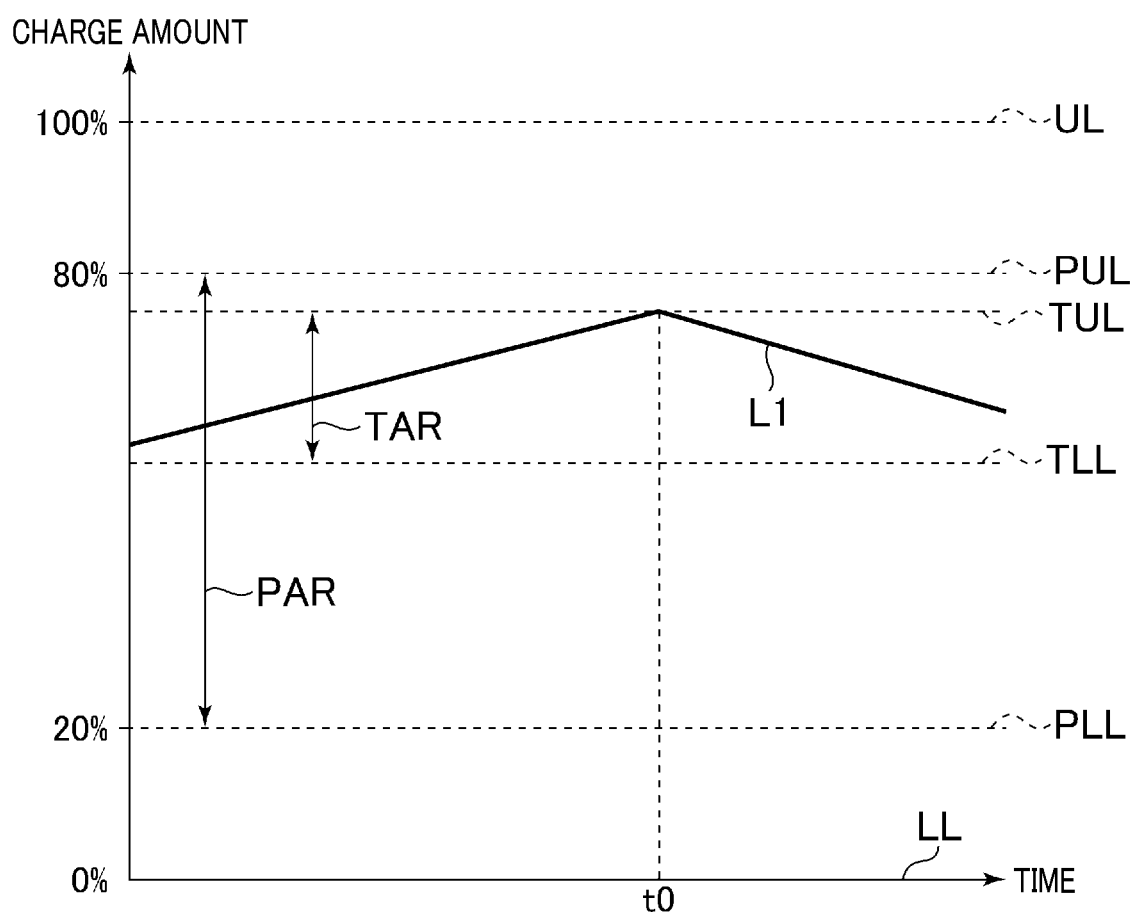
FIG. 4 is a diagram for explaining a range of a charge amount.

The adjustment of the charge amount will be described with reference to FIG. 4. A line L1 in FIG. 4 is a graph that shows an example of changes over time in the charge amount of the storage battery 20. A dotted line denoted by a reference symbol "UL" in FIG. 4 indicates a charge amount of 100%. The value of the charge amount indicated by this dotted line, that is, a maximum value of the charge amount to which the storage battery 20 can be changed is also referred to, hereafter, as a "maximum charge amount UL." Here, although a charge amount that is given in units of "%" as above should be referred to as a charging rate to be accurate, the term "charge amount" will be collectively used in the descriptions below.

A dotted line denoted by a reference symbol "LL" in FIG. 4 indicates a charge amount of 0%. The value of the charge amount indicated by this dotted line, that is, a minimum value of the charge amount to which the storage battery 20 can be charged is also referred to, hereafter, as a "minimum charge amount LL." Therefore, the charge amount of the storage battery 20 is any value from the minimum charge amount LL to the maximum charge amount UL.

A range of the charge amount indicated by an arrow PAR in FIG. 4 is preset as an appropriate range of the charge amount at which degradation of the storage battery 20 is reduced (i.e., degradation of the storage battery 20 hardly occurs). This range is also referred to, hereafter, as a "proper charge range." The proper charge range is preset based on the type and the characteristics of the storage battery 20.

A dotted line denoted by a reference symbol "PUL" in FIG. 4 indicates an upper limit value of the proper charge range. This upper limit value is also referred to, hereafter, as an "upper limit value PUL." In addition, a dotted line denoted by a reference symbol "PLL" in FIG. 4 indicates a lower limit value of the proper charge range. This lower limit value is also referred to, hereafter, as a "lower limit value PLL."

According to the present embodiment, the upper limit value PUL of the proper charge range is set to 80%. The lower limit value PLL is set to 20%. Here, the upper limit value PUL and the lower limit value PLL may be set as fixed values that are constant at all times, as according to the present embodiment. However, the setting values of upper limit value PUL and the lower limit value PLL may also be changed each time based on the state of the storage battery 20, elapsed time, and the like.

A range of the charge amount indicated by an arrow TAR in FIG. 4 is preset as the above-described "target range." As described above, the charging control unit 120 of the control apparatus 10 controls charging of the storage battery 20 such that the charge amount of the storage battery 20 falls within this target range.

A dotted line denoted by a reference symbol "TUL" in FIG. 4 indicates an upper limit value of the target range. This upper limit value is also referred to, hereafter, as an "upper limit value TUL." In addition, a dotted line denoted by a reference symbol "TLL" in FIG. 4 indicates a lower limit value of the target range. This lower limit value is also referred to, hereafter, as a "lower limit value TLL."

As indicated by the line L1, the charge amount of the storage battery 20 during charging falls within the range from the lower limit value TLL to the upper limit value TUL. In the example in FIG. 4, the storage battery 20 is charged during a period up to time t0. As a result of the charge amount reaching the upper limit value TUL at time t0, charging is stopped at time t0 onward.

Figure 3:
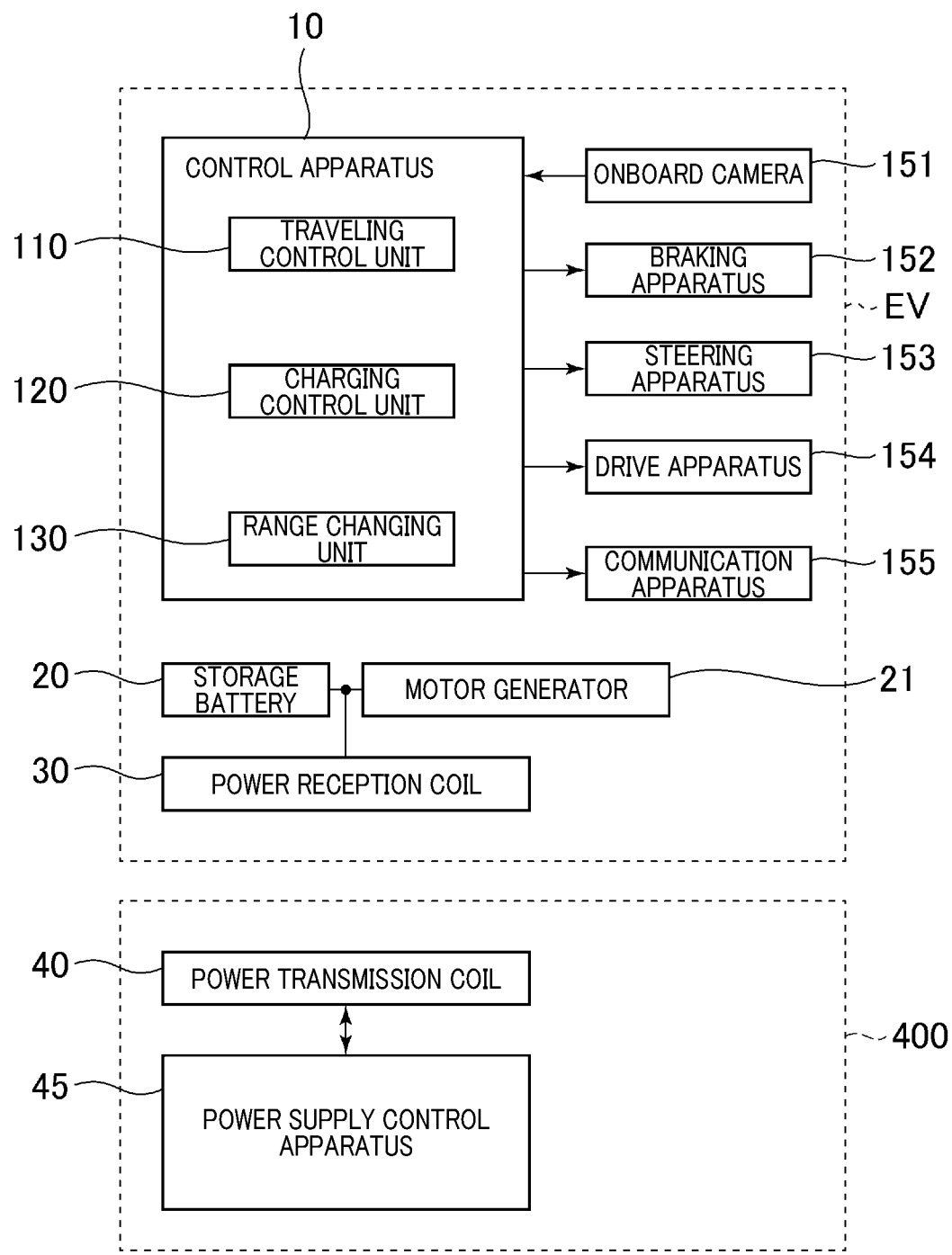
FIG. 3 is a diagram schematically showing a configuration of the electric vehicle and a configuration of the contactless power supply apparatus that is arranged in a power supply lane, according to the first embodiment.

Returning to the description with reference to FIG. 3, the range changing unit 130 changes at least one of the upper limit value TUL and the lower limit value TLL of the target range based on the state of the electric vehicle EV. That is, the upper limit value TUL and the lower limit value TLL of the target range are changed each time by the range changing unit 130, rather than being fixed at all times. Details of a specific process that is performed to change the upper limit value TUL and the like will be described hereafter. For example, the "state of the electric vehicle EV" includes whether the electric vehicle EV is traveling, the charge amount required for the electric vehicle EV to reach the next power supply location, an estimated amount of time until the electric vehicle EV that is stopped resumes traveling, the temperature of the storage battery 20, whether the storage battery 20 is degraded, and the like.

FIG. 3 schematically shows the configuration of the contactless power supply apparatus 400. Here, the contactless power supply apparatus 400 includes the power supply 44, the AC/DC converter 43, the inverters 41 shown in FIG. 2. However, these components are omitted in FIG. 3. The contactless power supply apparatus 400 includes the power supply control apparatus 45. The power supply control apparatus 45 controls the overall operation of the contactless power supply apparatus 400. In a manner similar to the control apparatus 10, the power supply control apparatus 45 is configured as a computer system that includes a CPU, a ROM, a RAM, and the like.

The power supply control apparatus 45 controls the operation of the inverter 41 and the like such that a current is flowing through the power transmission coil 40 when the electric vehicle EV passes over the power transmission coil 40. In addition, the power supply control apparatus 45 also provides a function for transmitting specifications (such as the positions of the power transmission coils 40) of the contactless power supply apparatus 400 and information (such as the above-described power supply capability) indicating an operating state of the contactless power supply apparatus 40 to the control apparatus 10 through communication. The communication may be directly performed between the control apparatus 10 and the power supply control apparatus 45. Alternatively, the communication may be indirectly performed via another vehicle or a server.

Figure 5:
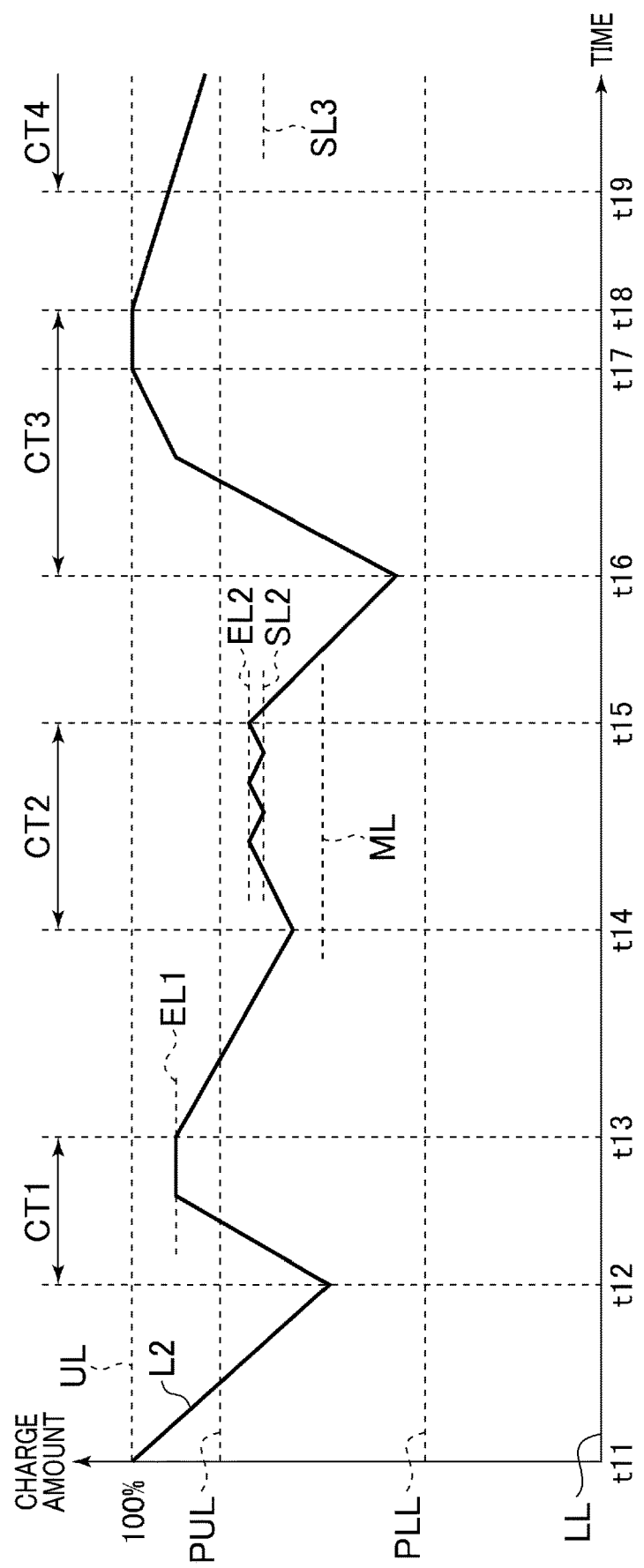
FIG. 5 is a graph of an example of changes in the charge amount over time.

An overview of control performed to adjust the charge amount, among control performed by the control apparatus 10, will be described with reference to FIG. 5. A line L2 in FIG. 5 is a graph of an example of changes over time in the charge amount of the storage battery 20 over a period of time that is longer that in the example in FIG. 4. In a manner similar to FIG. 4, FIG. 5 shows the minimum charge amount LL, the maximum charge amount UL, the lower limit value PLL, and the upper limit value PUL. However, the upper limit value TUL and the lower limit value TLL of the target range are omitted in FIG. 5.

A period from time t11 to time t12 is a period during which the electric vehicle EV is traveling on a travelling road that is not the power supply lane SLN. During this period, the storage battery 20 is not charged. The electric power stored in the storage battery 20 is consumed to enable the electric vehicle EV to travel. Therefore, during this period, the charge amount decreases with the passage of time.

A period CT1 from time t12 to time t13 is a period during which the electric vehicle EV is stopped at a power supply location. Therefore, during the period CT1, the storage battery 20 can be charged while the electric vehicle EV remains stopped. In FIG. 5, the periods during which the electric vehicle EV can be charged are periods CT1, CT2, CT3, and CT4.

The charging that is performed during the period CT1 is charging that is temporarily performed in a state in which the electric vehicle EV is stopped at a service area or the like before reaching a destination. Charging is performed over a brief period of time from time t12. As a result, the charge amount of the storage battery 20 increases with the passage of time. At this time, the power transmission coil 40 is present directly beneath the stopped electric vehicle EV at all times. As a result, charging is more efficiently performed compared to that when the electric vehicle EV is traveling. Therefore, the gradient of the line L2 during this period is relatively large.

In the example in FIG. 5, the charge amount reaches a predetermined threshold EL1 midway through the period CT1. Charging is stopped at this point. The threshold EL1 is set as an upper limit at which charging of the storage battery 20 is stopped. The charging control unit 120 stops charging when the charge amount of the storage battery 20 reaches the threshold EL1. The range changing unit 130 adjusts the threshold EL1 based on the upper limit value TUL of the target range (not shown in FIG. 5). The threshold EL1 may be set to the same value as the upper limit value TUL. Alternatively, the threshold EL1 may be set to a value that is slightly less than the upper limit value TUL, taking overshooting into consideration.

In the example in FIG. 5, the threshold EL1 and the upper limit value TUL of the target range are both set to values that are greater than the upper limit value PUL. In this manner, the range changing unit 130 according to the present embodiment sets the upper limit value TUL when charging is performed while the electric vehicle EV is stopped to a value that is greater than the upper limit PUL. As a result, the charge amount that is required until the electric vehicle EV reaches the power supply lane SLN can be reliably secured.

A period from time t13 to time t14 is a period during which the electric vehicle EV is again traveling on a travelling road that is not the power supply lane SLN. During this period, the storage battery 20 is not charged. The electric power stored in the storage battery 20 is consumed to enable the electric vehicle EV to travel. Therefore, during this period, the charge amount decreases with the passage of time.

The period CT2 from time t14 to time t15 is a period during which the electric vehicle EV is traveling in the power supply lane SLN. Therefore, during the period CT2, the storage battery 20 can be charged while the electric vehicle EV remains traveling.

The charging during traveling is performed from time t14 onward. The charge amount increases with the passage of time. Subsequently, when the charge amount reaches a predetermined threshold EL2, the charging of the storage battery 20 is temporarily stopped. After the charging is stopped, the charge amount decreases with the passage of time.

Subsequently, when the charge amount decreases to a predetermined threshold SL2, the charging during traveling is resumed. Therefore, the charge amount thereafter changes within a range from the threshold SL2 to the threshold EL2.

In a manner similar to the threshold EL1 described above, the threshold EL2 is set as an upper limit at which charging of the storage battery 20 is stopped. The range changing unit 130 sets the threshold EL2 based on the upper limit value TUL of the target range. The threshold EL2 and the upper limit value TUL of the target range are both set to values that are less than the upper limit value PUL. In this manner, the range changing unit 130 according to the present embodiment sets the upper limit value TUL when charging is performed while the electric vehicle EV is traveling to a value that is less than the upper limit value TUL when charging is performed while the electric vehicle EV is stopped or, specifically, a value that is less than the upper limit value PUL. Consequently, a situation in which the charge amount of the storage battery 20 is kept in a state that is close to fully charged and the secondary battery 20 becomes degraded can be prevented.

Here, the above-described threshold SL2 is set as a lower limit at which charging of the storage battery 20 is resumed. The charging control unit 120 resumes charging when the charge amount of the storage battery 20 decreases and reaches the threshold SL2. The range changing unit 130 adjusts the threshold SL2 based on the lower limit value TLL of the target range (not shown in FIG. 5). The threshold SL2 may be set to the same value as the lower limit value TLL. Alternatively, the threshold SL2 may be set to a value that is greater than the lower limit value TLL. The threshold SL2 in the example in FIG. 5 is set to a value that is slightly greater than the lower limit value TLL.

A dotted line ML shown in FIG. 5 indicates a median value of the proper charge range, that is, a value (50% according to the present embodiment) that is exactly midway between the upper limit value PUL and the lower limit value PLL. The threshold SL2 and the lower limit value TLL during the period CT2 are both values that are greater than this dotted line ML. The range changing unit 130 according to the present embodiment sets the upper limit value TUL and the lower limit value TLL of the target range such that the charge amount of the storage battery 20 is kept within a range from the median value to the upper limit value PUL of the proper charge range. Because the charge amount is kept within a range that is closer to the upper limit value PUL within the proper charge range, a charge amount of a certain degree can be ensured while suppressing degradation of the storage battery 20. Consequently, even cases in which an unexpected charge amount is required during subsequent traveling can be handled.

A period from time t15 to time t16 is a period during which the electric vehicle EV is again traveling on a travelling road that is not the power supply lane SLN. During this period, the storage battery 20 is not charged. The electric power stored in the storage battery 20 is consumed to enable the electric vehicle EV to travel. Therefore, during this period, the charge amount decreases with the passage of time.

The electric vehicle EV arrives at the destination at time t16. A period CT3 from time 16 to time t18 is a period during which the electric vehicle EV is stopped at a power supply location at the destination. Therefore, during the period CT3, the storage battery 20 can be charged while the electric vehicle EV remains stopped.

In the example in FIG. 5, charging is immediately started at time t16. As a result, the charge amount of the storage battery 20 increases with the passage of time. In a manner similar to that from time t12 onward, the gradient of the line L2 during a period from time t16 onward is relatively large.

The charging from time t16 onward continues until the charge amount of the storage battery 20 reaches the maximum charge amount UL. That is, from time t16 onward, the upper limit TUL of the target range is set to the same value as the maximum charge amount UL.

At this time, the value of the current with which the storage battery 20 is charged is reduced before the charge amount reaches the maximum charge amount UL. That is, charging speed is reduced. This process is performed to prevent a situation in which the storage battery 20 is further charged as a result of overshooting after the charge amount has reached the maximum charge amount UL. Control in which the charging speed is reduced before charging is completed in this manner is also referred to, hereafter, as "overshoot prevention control." Here, the overshoot prevention control is not performed in the charging that is started at time t12 because the charge amount does not reach the maximum charge amount UL even if overshooting occurs.

From time t16 onward, the electric vehicle EV has arrived at the destination. Therefore, compared to when the charging is performed from time t12 (that is, before arrival at the destination), the period required until the electric vehicle EV resumes traveling is considered to be long. Therefore, in the charging that is performed from time t16 onward, the upper limit value TUL of the target range is set to be greater than that in the charging from time t12 onward. As a result, a situation in which the charge amount becomes insufficient before the electric vehicle EV next reaches the power supply lane SLN can be prevented with further certainty.

In other words, the range changing unit 130 is configured to perform charging while the electric vehicle EV is stopped upon setting the upper limit value TUL of the target range when the period until the electric vehicle EV resumes traveling is expected to be short (period CT1) to a value that is less than the upper limit value TUL of the target range when the period until the electric vehicle EV resumes traveling is expected to be long (period CT2). Consequently, when the electric vehicle EV resumes traveling and is able to reach the power supply lane SLN at an early stage, as a result of the charge amount being set to be small in advance, the subsequent charge amount can be prevented from being kept in a state that is close to fully charged.

In the example in FIG. 5, the electric vehicle EV resumes traveling at time t18 after the storage battery 20 has been fully charged. In accompaniment, from time t18 onward, the charge amount decreases with the passage of time.

A period CT4 from subsequent time t19 onward is a period during which the electric vehicle EV is traveling in the power supply lane SLN. However, the charge amount of the storage battery 20 at this time is greater than the upper limit value PUL of the appropriate charging range and greater than the upper limit value TUL of the target range (not shown) that is below the upper limit value PUL. Therefore, although the electric vehicle EV is traveling in the power supply lane SLN, the storage battery 20 is not charged. Here, in a manner similar to the threshold SL2, a threshold SL3 in FIG. 5 is set as a lower limit at which charging of the storage battery 20 is resumed. The charging control unit 120 resumes charging when the charge amount of the storage battery 20 decreases and reaches the threshold SL3.

Figure 6:
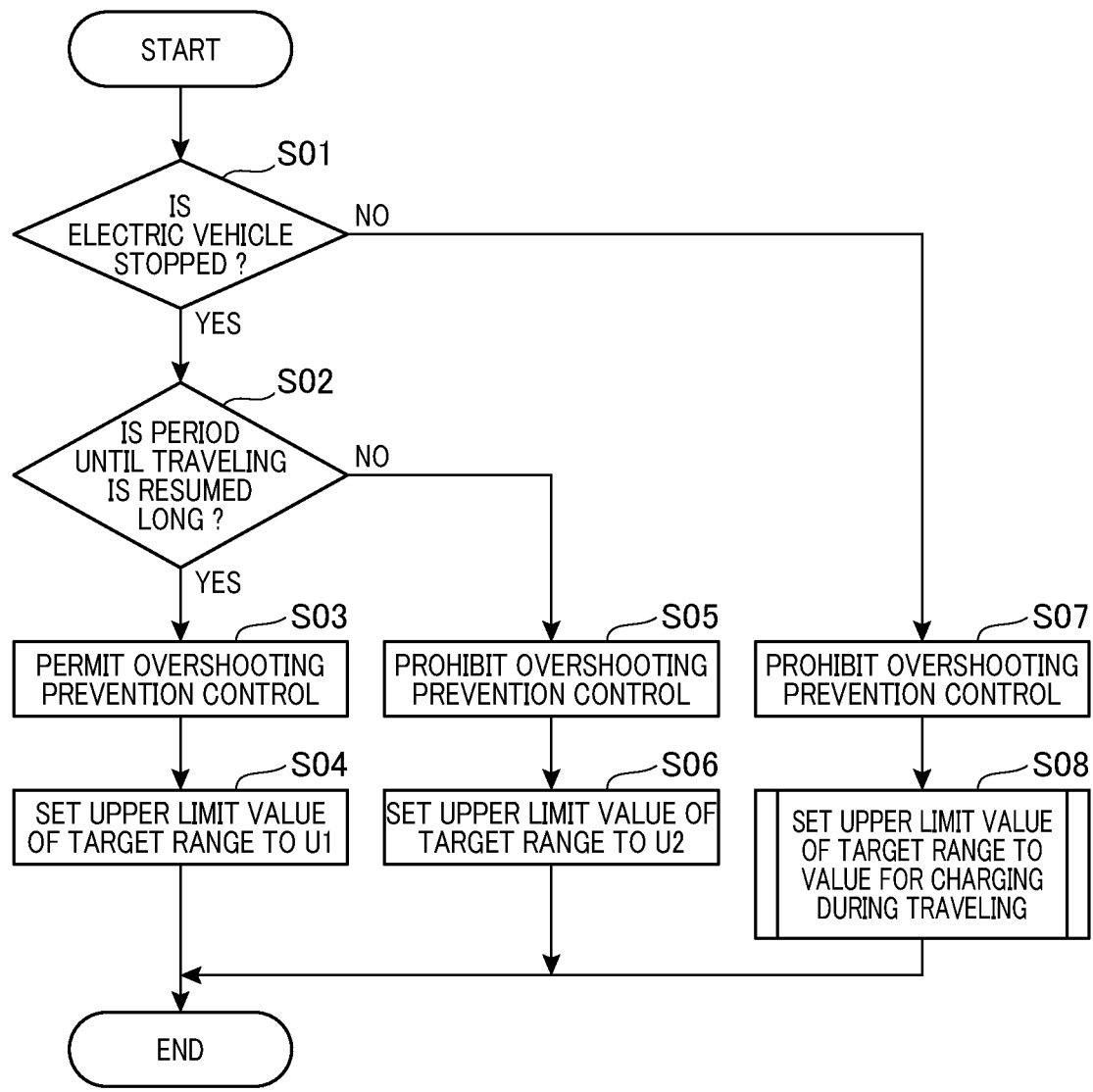
FIG. 6 is a flowchart of the flow of processes performed by the control apparatus according to the first embodiment.

A detailed flow of processes performed by the control apparatus 10 to implement control such as that described above will be described with reference to FIG. 6. The series of processes shown in FIG. 6 are performed by the control apparatus 10 when the storage battery 20 is charged or immediately therebefore.

At an initial step S01 of the processes, the control apparatus 10 determines whether the electric vehicle EV is stopped. For example, the control apparatus 10 can perform the determination based on an output from a speed sensor (not shown) that is provided in the electric vehicle EV. When determined that the electric vehicle EV is stopped, the control apparatus 10 proceeds to step S02.

At step S02, the control apparatus 10 estimates the period until the electric vehicle EV resumes traveling and determines whether the period is long. For example, the control apparatus 10 can perform the determination by comparing the estimated period with a predetermined period preset.

The "period until the electric vehicle EV resumes traveling" can be estimated based on the type of location in which the electric vehicle EV is currently stopped. For example, when the electric vehicle EV is stopped in a parking space at home, the control apparatus 10 estimates that the electric vehicle EV will not resume traveling for a relatively long period of time. In addition, when the electric vehicle EV is stopped at a destination that is preset, when charging is being performed while the electric vehicle EV is stopped, when a passenger is performing an operation such as issuing an instruction to perform charging to a fully charged state, or the like, the control apparatus 10 estimates that the electric vehicle EV will not resume traveling for a relatively long period of time. Furthermore, when the electric vehicle EV is not an autonomous vehicle and confirmation that a passenger in the driver's seat inside the vehicle cabin is asleep is made through a camera or the like, the control apparatus 10 estimates that the electric vehicle EV will not resume traveling for a relatively long period of time.

Meanwhile, when the electric vehicle EV is stopped in a location that is on the way to the destination, such as a parking lot of a service area or a store, the control apparatus 10 estimates that the electric vehicle EV will resume traveling within a relatively short period of time. In addition, when the electric vehicle EV is stopped while hazard lights are turned on or an ignition switch is turned on, or when the electric vehicle EV is stopped at a traffic light, the control apparatus 10 estimates that the electric vehicle EV will resume traveling within a relatively short period of time.

When determined that the period until the electric vehicle EV resumes traveling is long at step S02, the control apparatus 10 proceeds to step S03. The control apparatus 10 subsequently performs a process to charge the storage battery 20 to a fully charged state or a state that is close to fully charged, as in the period from time t16 onward in the example in FIG. 5.

At step S03, the control apparatus 10 performs a process to permit execution of the overshoot prevention control described above. As a result, the value of the current with which the storage battery 20 is charged is reduced before the charge amount reaches the upper limit value TUL. Overcharging in which the charge amount exceeds the maximum charge amount UL is prevented.

At step S04 following step S03, the control apparatus 10 performs a process to set the upper limit value TUL of the target range to U1. U1 is a value that is greater than the upper limit value PUL of the appropriate charging range. For example, U1 is the maximum charge amount UL. As a result, charging such as that performed during the period from time t16 onward in FIG. 5 is implemented.

When determined that the period until the electric vehicle EV resumes traveling is short at step S02, the control apparatus 10 proceeds to step S05. The control apparatus 10 subsequently performs a process to charge the storage battery 20 to a degree that the charge amount exceeds the upper limit value PUL, as in the period from time t12 onward in the example in FIG. 5.

At step S05, the control apparatus 10 performs a process to prohibit execution of the overshoot prevention control. At step S06 following step S05, the control apparatus 10 performs a process to set the upper limit value TUL of the target range to U2. U2 is a value that is greater than the upper limit value PUL of the proper charge range, and less than U1 set at step S04. Therefore, U2 is less than the maximum charge amount UL.

In this case, the overshoot prevention control is not performed. Therefore, charging up to the upper limit value TUL can be completed in a short amount of time. U2 that is the upper limit value TUL of the target range is less than the maximum charge amount UL. Therefore, even if overshooting occurs upon completion of charging, the charge amount does not exceed the maximum charge amount UL.

Here, the charging speed of the charging that is performed after step S06 may be the same as the charging speed of the charging that is performed after step S05. Alternatively, the charging speed of the charging that is performed after step S06 may be faster than the charging speed of the charging that is performed after step S05. This similarly applies to the charging that is performed after step S08, described hereafter.

When determined that the electric vehicle EV is not stopped and is traveling at step S01, the control apparatus 10 proceeds to step S07. The control apparatus 10 subsequently performs a process to charge the storage battery 20 within a range in which the charge amount does not exceed the upper limit value PUL (as a rule), as in the period from time t14 onward in the example in FIG. 5.

Figure 7:
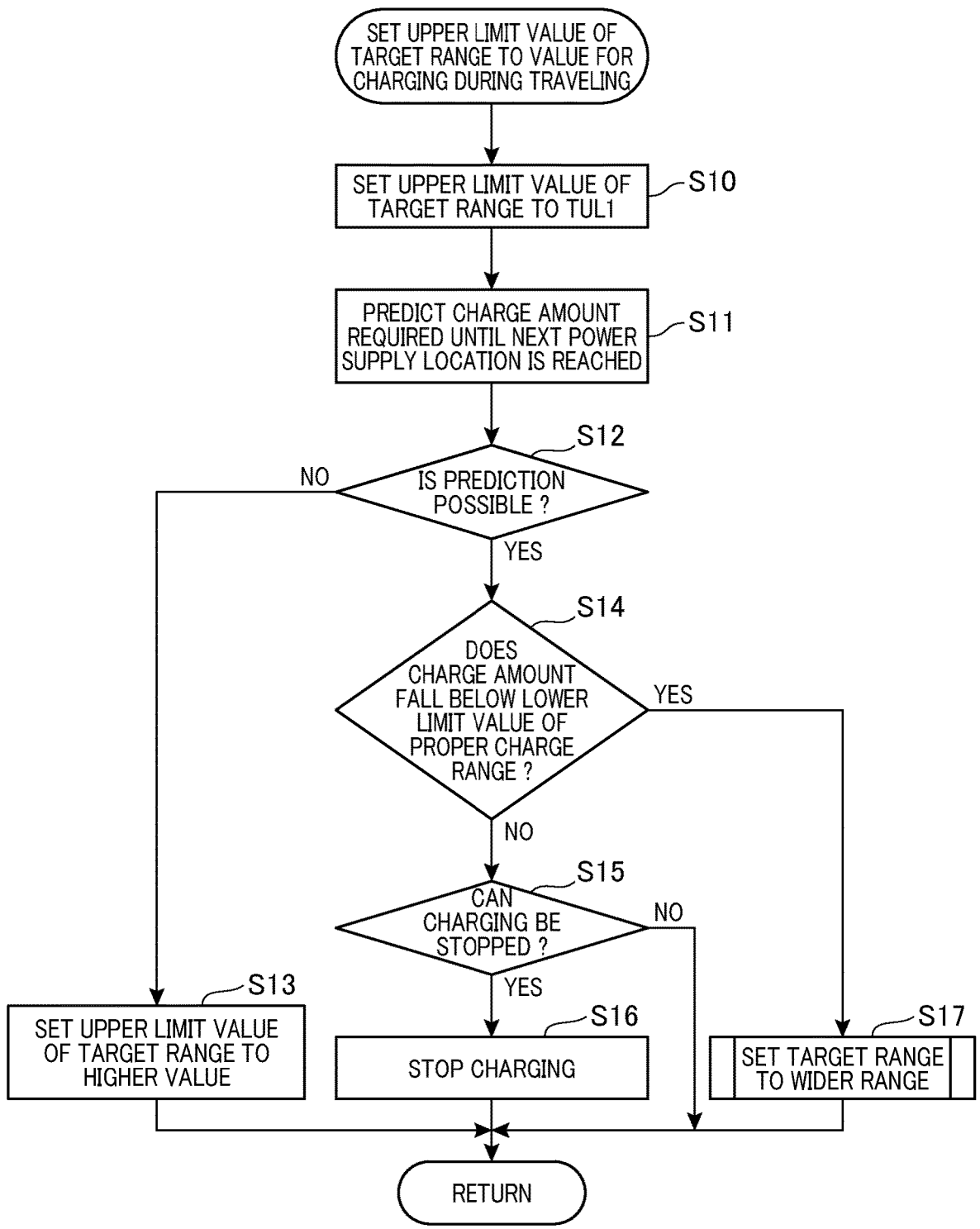
FIG. 7 is a flowchart of the flow of processes performed by the control apparatus according to the first embodiment.
Figure 9:
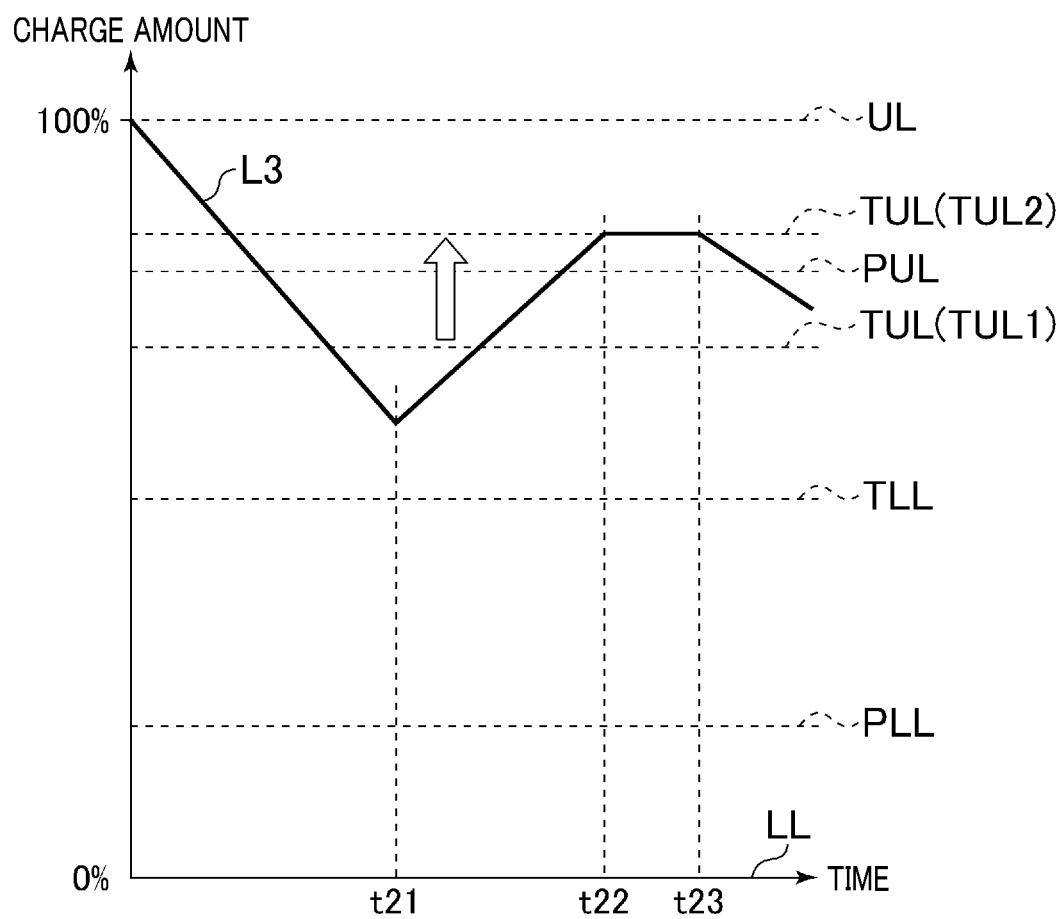
FIG. 9 is a graph of an example of the changes in the charge amount over time.

At step S07, the control apparatus 10 performs a process to prohibit execution of the overshoot prevention control. At step S08 following step S07, the control apparatus 10 performs a process to set the upper limit value TUL of the target range to the value for charging during traveling. Specific details of this process will be described with reference to FIG. 7. The flowchart in FIG. 7 shows the flow of processes performed at step S08 in FIG. 6. At an initial step S10 of the process, the control apparatus 10 performs a process to set the upper limit value TUL of the target range to TUL1 that is a provisionary value. As shown in FIG. 9, TUL1 is set to a value that is less than the maximum charge amount UL and less than the upper limit value PUL of the proper charge range. Here, TUL1 may be set to the same value as the upper limit value PUL.

At step S11 following step S10, the control apparatus 10 performs a process to predict the charge amount (electric power amount) that will be required for the electric vehicle EV to reach the next power supply location after passing through the current power supply lane SLN. The "next power supply location" is the next power supply lane SLN present on the route on which the electric vehicle EV is traveling, a service area that includes a power supply facility, a location at which power supply can be performed that is preset as a stop by a user, or the like. The above-described charge amount can be considered to be the charge amount of the storage battery 20 that will be required until the electric vehicle EV reaches the next location at which power supply can be performed. This charge amount is also referred to, hereafter, as a "required charge amount."

Figure 8:
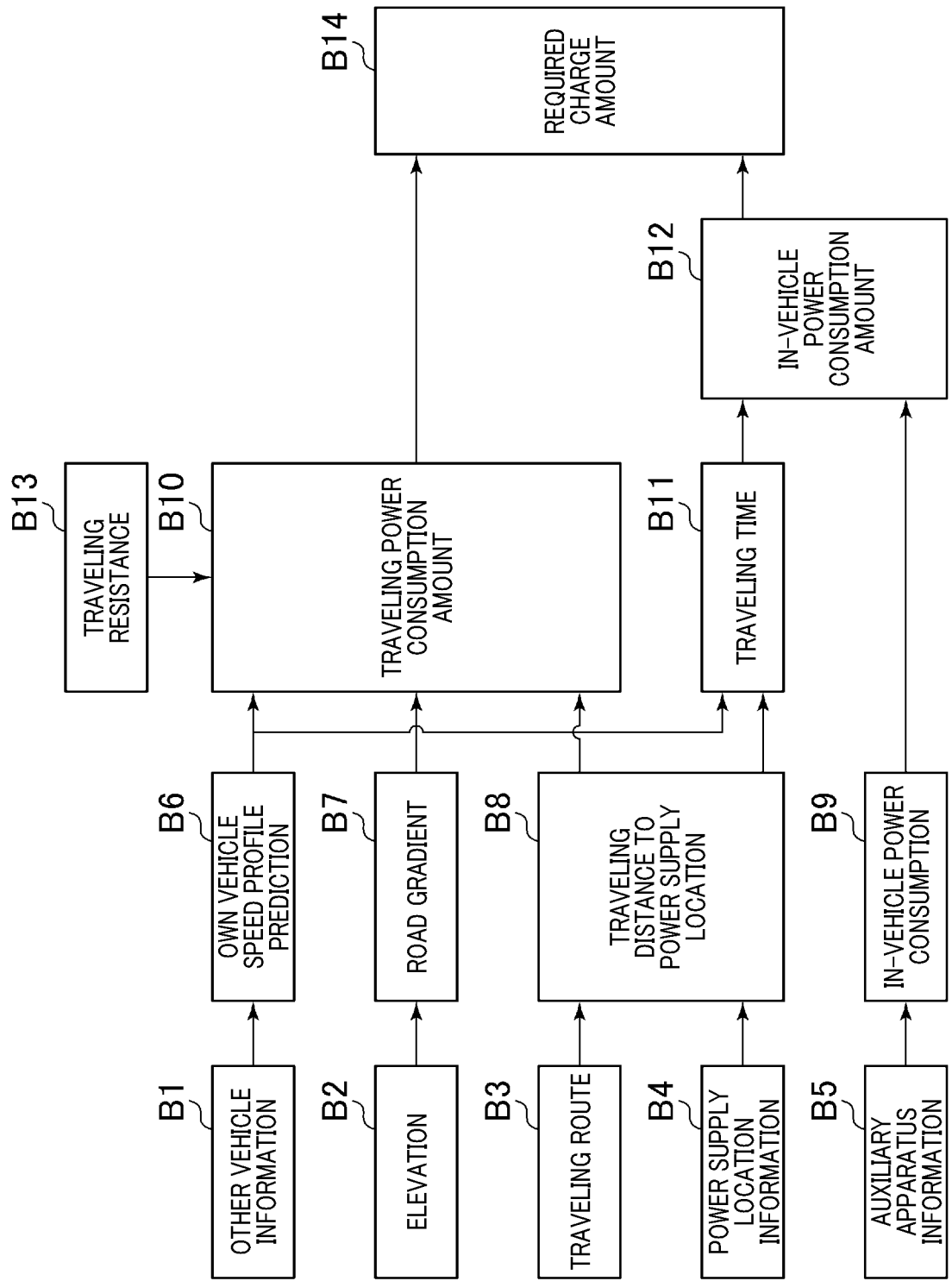
FIG. 8 is a diagram for explaining a method for calculating a required charge amount.

A method for predicting the required charge amount will be described with reference to FIG. 8. A plurality of elements that are required for the control apparatus 10 to perform the above-described prediction are shown as blocks (such as B1).

"Other vehicle information" in block B1 is the traveling position and the speed of another vehicle or those of a plurality of other vehicles that are traveling in the periphery. For example, the control apparatus 10 can directly acquire the other vehicle information such as this from the other vehicle by wireless communication. The control apparatus 10 can also acquire the other vehicle information from a management system that manages the road.

"Elevation" in block B2 is the elevation at the traveling position of the electric vehicle EV. The control apparatus 10 acquires the elevation at each position through which the electric vehicle EV subsequently travels by referencing map information provided by a navigation system (not shown).

"Traveling route" in block B3 is information on a traveling route set by the navigation system, that is, a path on which the electric vehicle EV is to travel.

"Power supply location information" in block B4 is information on a location (such as the power supply lane SLN or a service area) at which power supply can be performed that is present near the electric vehicle EV. For example, the information includes the position and the power supply capability of the power supply lane SNL. For example, the control apparatus 10 can acquire the power supply location information such as this by referencing the map information provided by the navigation system, or from the power supply control apparatus 45 through wireless communication.

"Auxiliary apparatus information" in block B5 is the specifications (power consumption) and the operating states of various auxiliary apparatuses provided in the electric vehicle EV, such as a vehicle air-conditioning apparatus (not shown), the navigation system, and the like. The control apparatus 10 can acquire the auxiliary apparatus information such as this from an electronic control unit (ECU) that controls operations of the auxiliary apparatuses.

"Own vehicle speed profile" in block B6 is information indicating subsequent changes in the traveling speed (profile) of the electric vehicle EV. The control apparatus 10 predicts and calculates the own vehicle speed profile based on the other vehicle information in block B1.

"Road gradient" in block B7 is a gradient of the road on which the electric vehicle EV is traveling. The control apparatus 10 can calculate the road gradient based on changes in the elevation along the travelling road.

"Traveling distance" in block B8 is a distance traveled by the electric vehicle EV from a current position to a next location at which power supply can be performed. The control apparatus 10 can calculate the traveling distance based on the traveling route in block B3 and the power supply location information in block B4.

"In-vehicle power consumption" in block B9 is an amount of electric power consumed per unit time (that is, power consumption) by the various auxiliary apparatuses provided in the electric vehicle EV while the electric vehicle EV is traveling. The control apparatus 10 can calculate the in-vehicle power consumption based on the auxiliary apparatus information in block B5.

"Traveling power consumption amount" in block 10 is an amount of electric power consumed for traveling by the electric vehicle EV (not the auxiliary apparatuses) until the electric vehicle EV reaches the destination. The control apparatus 10 calculates the traveling power consumption amount based on the own vehicle speed profile in block B6, the road gradient in block B7, and the traveling distance in block B8.

When calculating the traveling power consumption amount, the control apparatus 10 may take into consideration error factors such as traveling resistance in block B13 and weight of the overall electric vehicle EV.

"Traveling time" in block B11 is a required amount of time until the electric vehicle EV reaches the destination. The control apparatus 10 can calculate the traveling time based on the own vehicle speed profile in block B6 and the traveling distance in block B8.

"In-vehicle power consumption amount" in block B12 is an amount of electric power consumed by the auxiliary apparatuses, rather than for the traveling of the electric vehicle EV, until the electric vehicle EV reaches the destination. The control apparatus 10 calculates the in-vehicle power consumption amount by multiplying the in-vehicle power consumption amount in block B9 with the traveling time in block B11.

"Required charge amount" in block B14, that is, the required charge amount predicted at step S11 in FIG. 7 is calculated by the in-vehicle power consumption amount in block B12 being added to the traveling power consumption amount in block B10. At this time, the control apparatus 10 may further add a predetermined margin, taking into consideration calculation error.

Here, when the required charge amount is calculated and predicted as described above, the control apparatus 10 may not be able to make a prediction that has a certain degree of accuracy as a result of some of the required information being missing or not accurately acquired. For example, when the destination is not set in the navigation system and the traveling route in block B13 cannot be acquired, the control apparatus 10 cannot predict the required charge amount. Therefore, in such cases, the control apparatus 10 does not calculate the required charge amount.

Here, when the destination is not set in the navigation system, the control apparatus 10 may predict and calculate the required charge amount under a premise that the "next power supply location" is the farthest power supply location among power supply locations that are on the advancing direction side and within the range of a predetermined distance, or power supply locations that are on a plurality of virtual routes on the advancing direction side and that can be considered upon limiting the route to main roads such as arterial roads, among the plurality of power supply locations present in the vicinity of the current position of the electric vehicle EV.

Returning to the description with reference to FIG. 7, after predicting the required charge amount at step S11, the control apparatus 10 proceeds to step S12. At step S12, the control apparatus 10 determines whether the prediction of the required charge amount has been possible at step S11. When determined that the prediction has not been possible and the required charge amount is unknown, the control apparatus 10 proceeds to step S13. At step S13, the control apparatus 10 performs a process to set the upper limit value TUL of the target range to a higher value. FIG. 9 shows an example of the upper limit value TUL that has been set to a higher value in this manner.

In FIG. 9, a line L3 indicates the changes over time in the charge amount when the electric vehicle EV is traveling in the power supply lane SLN and the storage battery 20 is being charged during a period from time t21 to time t23. As described above, TUL1 shown in FIG. 9 is the value of the initial upper limit value TUL set at step S10. In addition, TUL2 shown in FIG. 9 is a value of the upper limit value TUL of the target range after the process at step S13 in FIG. 7 is performed. In the example in FIG. 9, the charge amount reaches TUL2 at time t22. Therefore, during the period from time t22 to time t23, the charging current is adjusted such that the charge amount is fixed.

As a result of the process at step S13 being performed, the upper limit value TUL is changed from the initial value (TUL1) set at step S10 to a value (TUL2) that is greater than the upper limit value PUL. Here, TUL2 that is the value after the change is a value that is less than either of the values (U1 and U2) respectively set at step S04 and step S06 in FIG. 6.

Returning to the description with reference to FIG. 7, when determined that the prediction of the required charge amount has been possible at step S11, that is, when the required charge amount is known, the control apparatus 10 proceeds from step S12 to step S14. At step S14, the control apparatus 10 determines whether the charge amount upon arrival of the electric vehicle EV at the next power supply location falls below the lower limit value PLL of the proper charge range. The "charge amount upon arrival of the electric vehicle EV at the next power supply location" is a charge amount that is obtained by the required charge amount predicted at step S11 being subtracted from the charge amount (which, in many cases, coincides with the upper limit value TUL of the target range) when the electric vehicle EV has passed through the power supply lane SLN in which the electric vehicle EV is currently traveling. This charge amount can be considered to be the charge amount that is predicted as the charge amount when the electric vehicle EV next reaches a location at which power supply can be performed.

When determined that the charge amount when the electric vehicle EV reaches the next power supply location is equal to or greater than the lower limit value PLL, the control apparatus 10 proceeds to step S15. At step S15, the control apparatus 10 determines whether charging can be stopped at the current time. Here, the control apparatus 10 determines that charging can be stopped when the charge amount when the electric vehicle EV reaches the next power supply location does not fall below the lower limit value PLL even when the charging is stopped at the current time. The "charge amount when the electric vehicle EV reaches the next power supply location" is a charge amount that is obtained by the required charge amount being subtracted from the charge amount at the current time.

When determined that the charging can be stopped, the control apparatus 10 proceeds to step S16. At step S16, the control apparatus 10 performs a process to immediately stop charging the storage battery 20, through the charging control unit 120. In this manner, the charging control unit 120 according to the present embodiment stops the charging of the storage battery 20 that is currently being performed when the charge amount of the storage battery 20 secured to a degree that the charge amount does not fall below the lower limit value PLL before the electric vehicle EV reaches the next location at which power supply can be performed.

Consequently, the charge amount of the storage battery 20 can be kept within the proper charge range while suppressing charging during traveling to a minimum. In this case, required charging is performed after the electric vehicle EV reaches the destination and stops. Therefore, an advantage is achieved in that power supply during stopping, which is highly efficient, can be preferentially performed over power supply during traveling, which is low in efficiency.

When determined that the charging cannot be stopped at the current time at step S15, the control apparatus 10 ends the series of processes shown in FIG. 7. In this case, the upper limit value TUL of the target range is maintained at the initial TUL1 set at step S10.

As described above, the range changing unit 130 sets the upper limit value TUL of the target range when the required charge amount is unknown (NO at step S12) to a value that is greater than the upper limit value TUL of the target range when the required charge amount is known (YES at step S12). Consequently, a situation in which the charge amount becomes insufficient under subsequent unforeseen conditions can be prevented.

When determined that the charge amount when the electric vehicle EV reaches the next power supply location falls below the lower limit value PLL at step S14, the control apparatus 10 proceeds to step S17. In this case, even if the charging that is currently being performed is continued as is, the charge amount may fall outside the proper charge range before the next power supply location is reached. Therefore, at step S17, the control apparatus 10 performs a process to reset the target range to a wider range such that the charge amount falls within the proper charge range.

Here, when determined that the charge amount when the electric vehicle EV reaches the next power supply location falls below the lower limit value PLL, the control apparatus 10 may perform the processes at step S11 and subsequent steps again upon reducing power consumption of the electric vehicle EV. For example, "reducing power consumption of the electric vehicle EV" includes stopping some of the operations of the auxiliary apparatuses, changing the vehicle speed to a more energy-efficient speed, or changing the traveling route to a route towards a nearby power supply location.

Figure 10:
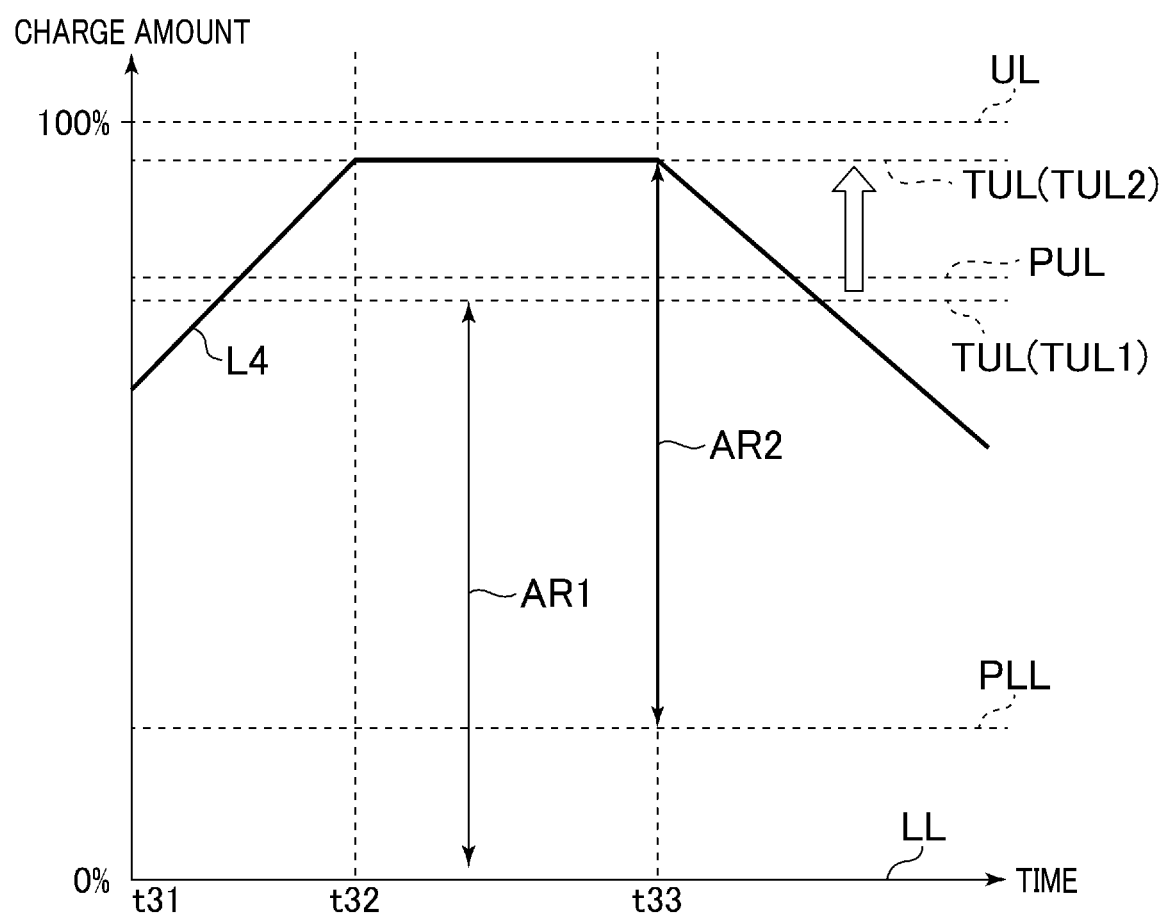
FIG. 10 is a graph of an example of the changes in the charge amount over time.

An overview of the process performed at step S17 will be described with reference to FIG. 10. In FIG. 10, a line L4 indicates the changes over time in the charge amount when the electric vehicle EV is traveling in the power supply lane SLN and the storage battery 20 is being charged during a period from time t31 to time t33. TUL1 shown in FIG. 10 is the value of the upper limit value TUL of the initial target range before the process at step S17 in FIG. 7 is performed. In addition, TUL2 shown in FIG. 10 is the value of the upper limit value TUL of the target range after the process at step S17 in FIG. 7 is performed.

Arrows AR1 and AR2 in FIG. 10 each indicate the charge amount that is required for the electric vehicle EV to reach the next power supply location, that is, the required charge amount predicted at step S11 in FIG. 7. If the upper limit value TUL of the target range remains set at the initial TUL1, the charge amount after the electric vehicle EV has passed through the power supply lane SLN decreases from TUL1 by an amount amounting to the arrow AR1. Therefore, the charge amount falls below the lower limit value PLL before the electric vehicle EV reaches the next power supply location.

In contrast, according to the present embodiment, the upper limit value TUL of the target range is changed from TUL1 to TUL2. Therefore, the charge amount after the electric vehicle EV has passed through the power supply lane SLN decreases from TUL2 only by an amount amounting to the arrow AR2. As shown in FIG. 10, the charge amount after the decrease coincides with the lower limit value PLL. In other words, the value of TUL2 is a value that is calculated by the required charge amount (arrow AR2) being added to the lower limit value PLL. At this time, a margin may be further added as required.

In this manner, the range changing unit 130 according to the present embodiment sets the upper limit value TUL of the target range when charging while the electric vehicle EV is traveling is performed such that the charge amount that is predicted as the charge amount when the electric vehicle EV next reaches a location at which power supply can be performed does not fall below the lower limit value PLL of the proper charge range. Consequently, the charge amount during traveling can be maintained within the proper charge range at all times.

Figure 11:
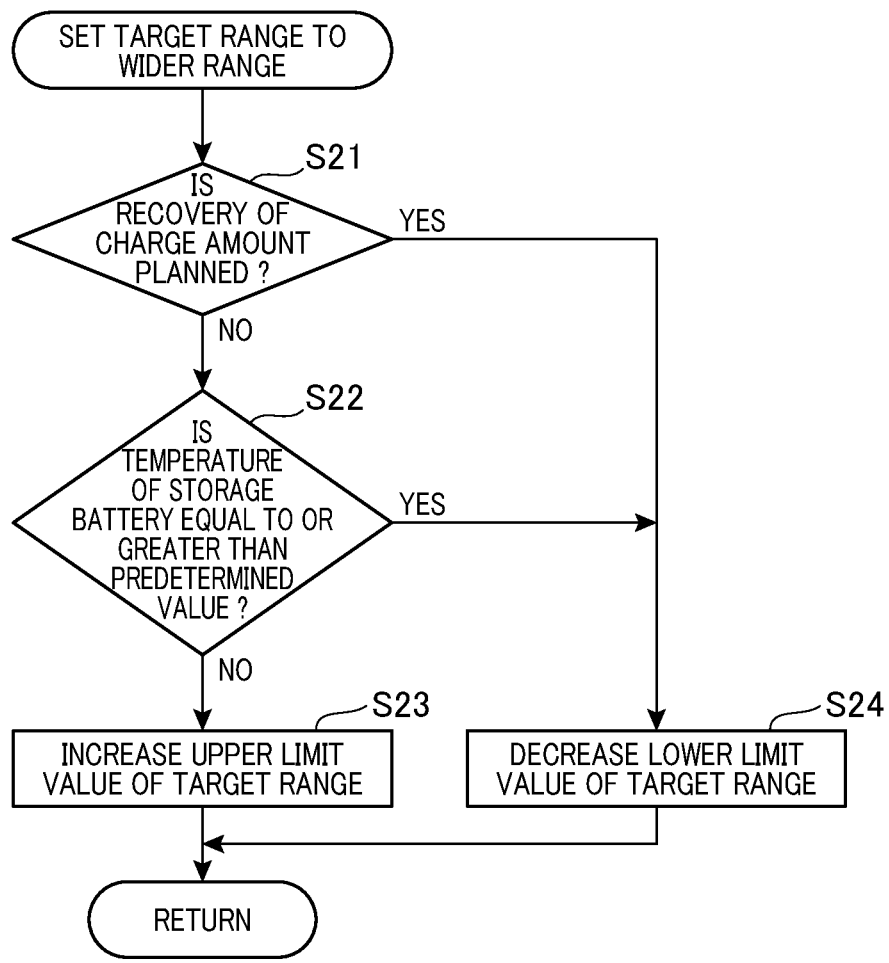
FIG. 11 is a flowchart of the flow of processes performed by the control apparatus according to the first embodiment.

A specific process for actualizing control such as that described above will be described with reference to FIG. 11. The flowchart in FIG. 11 shows the flow of processes performed at step S17 in FIG. 7.

At an initial step S21, the control apparatus 10 determines whether recovery of the charge amount is planned on the path on which the electric vehicle EV is to subsequently travel. For example, "recovery of the charge amount is planned" refers to the generation of regenerative electric power being expected on a downhill or the like, or charging while the electric vehicle EV is stopped in a service area or the like on the path being planned. At step S21, the control apparatus 10 determines that recovery of the charge amount is planned when a recovery amount of the charge amount that is expected is equal to or greater than a predetermined value.

When determined that recovery of the charge amount is not planned, the control apparatus 10 proceeds to step S22. At step S22, the control apparatus 10 acquires the temperature of the storage battery 20 from a temperature sensor (not shown) that is attached to the storage battery 20. The control apparatus 20 then determines whether the temperature is equal to or greater than a predetermined value. The above-described predetermined value is preset as an upper limit of an appropriate temperature range when the storage battery 20 is functioning in a normal manner. When determined that the temperature of the storage battery 20 is less than the predetermined value, the control apparatus 10 proceeds to step S23. At step S23, the control apparatus 10 performs the process to increase the upper limit value TUL of the target range from TUL1 to TUL2, as described with reference to FIG. 10.

When determined that recovery of the charge amount is planned at step S21, the control apparatus 10 proceeds to step S24. At step S24, the control apparatus 10 performs a process to decrease the lower limit value TLL of the target range. This process will be described with reference to FIG. 12.

Figure 12:
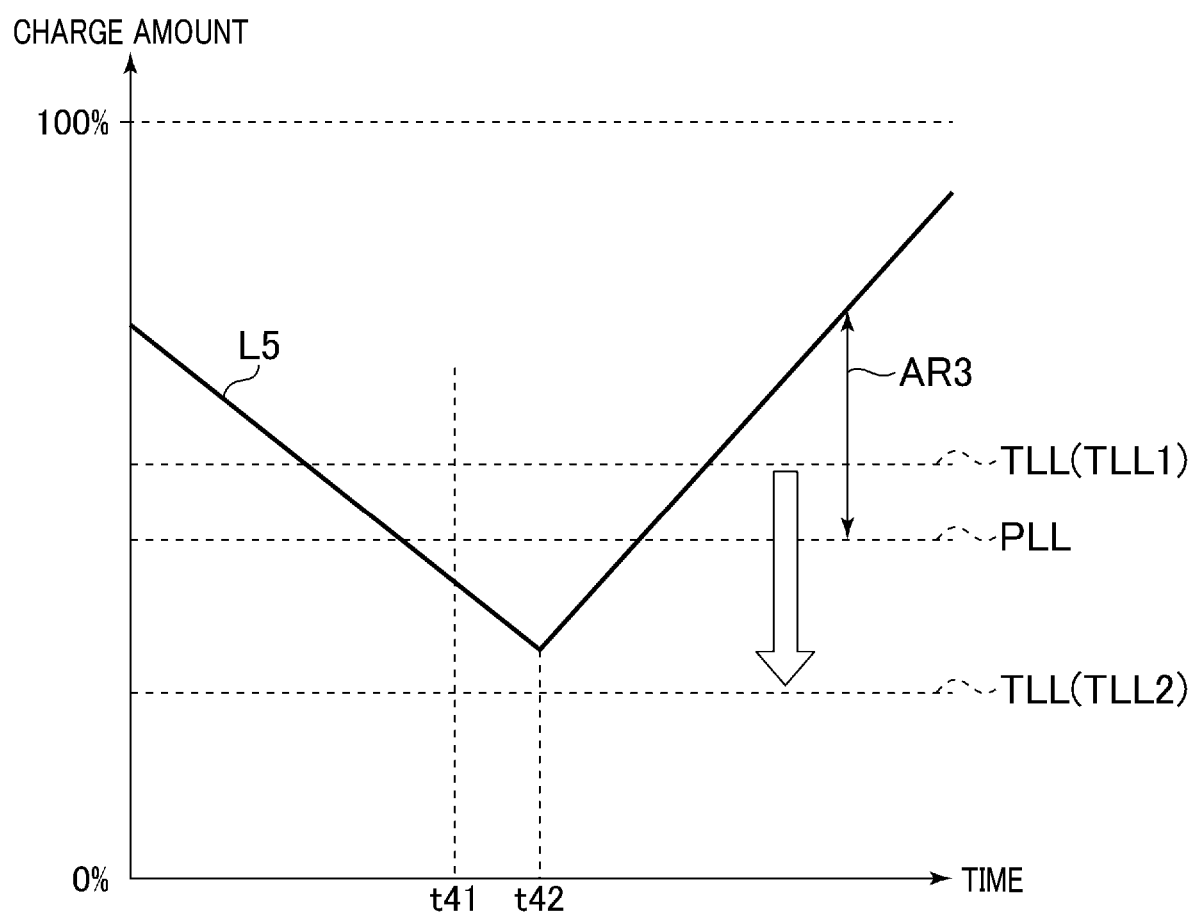
FIG. 12 is a graph of an example of the changes in the charge amount over time.

In FIG. 12, a line L5 indicates the changes over time in the charge amount when the electric vehicle EV is traveling in the power supply lane SLN during a period up to time t41. Here, time t42 following time t41 is the time at which the electric vehicle EV reaches a downhill and the generation of regenerative electric power is started.

TLL1 shown in FIG. 12 is a value of the initial lower limit value TLL of the target range before the process at step S24 in FIG. 11 is performed. In addition, TLL2 shown in FIG. 12 is a value of the lower limit value TLL of the target range after the process at step S24 in FIG. 11 is performed. In comparison with the lower limit value PLL of the proper charge range, the initial TLL1 is greater than the lower limit value PLL and TLL2 after the change is less than the lower limit value PLL.

As a result of the value of the lower limit value TLL of the target range being decreased as described above, the storage battery 20 is not charged during the period up to time t41, regardless of the electric vehicle EV traveling in the power supply lane SLN. Therefore, during the period up to time t42, the charge amount of the storage battery 20 decreases with the passage of time and falls below the lower limit value PLL of the proper charge range.

At time t42 onward, regenerative electric power is generated. The storage battery 20 is charged by the generated regenerative electric power. Therefore, the charge amount of the storage battery 20 increases with the passage of time and ultimately exceeds the lower limit value PLL of the proper charge range.

An arrow AR3 in FIG. 12 indicates the charge amount required for the electric vehicle EV to reach the next power supply location, that is, the required charge amount predicted at step S11 in FIG. 7. In the example in FIG. 12, as a result of the storage battery 20 being charged by regenerative electric power, the charge amount is greater than a value obtained by the charge amount indicated by the arrow AR3 being added to the lower limit value PLL. As a result, the electric vehicle EV can subsequently reach the next power supply location while the charge amount is kept in a state greater than the lower limit value PLL.

As described above, at step S21 in FIG. 11, the control apparatus 10 determines that recovery of the charge amount is planned when the recovery amount of the charge amount that is expected is equal to or greater than a predetermined value. The "predetermined value" herein refers to a minimum recovery amount that enables the electric vehicle EV to reach the destination while keeping the charge amount equal to or greater than the lower limit value PLL. Instead of a mode such as this, the predetermined value may be set to a minimum recovery amount that enables the electric vehicle EV to reach the destination while keeping the charge amount in a state greater than the minimum charge amount LL.

Here, a case in which regenerative electric power is generated at time t42 onward is described above. However, the foregoing similarly applies to a case in which the electric vehicle EV is supplied power while being stopped at time t42 onward.

As described above, when the control apparatus 10 predicts that the electric power required for the electric vehicle EV to travel can be acquired through the generation of regenerative electric power or the storage battery 20 being charged while the electric vehicle EV is stopped on the path on which the electric vehicle EV is to subsequently travel, the range changing unit 130 according to the present embodiment sets the lower limit value TLL of the target range to a value that is less than the lower limit value PLL of the proper charge range. In this case, the charge amount temporarily falls outside the proper charge range. However, the charge amount can be subsequently acquired through regeneration or the like. Therefore, the charge amount can be returned to be within the proper charge range in a relatively short amount of time.

The control apparatus 10 also proceeds to step S24 when determined that the temperature of the storage battery 20 is equal to or greater than the predetermined value at step S22 in FIG. 11. In this case as well, the control apparatus 10 performs the process to decrease the lower limit value TLL of the target range to a value that is less than the lower limit value PLL of the proper charge range. In this manner, when the temperature of the storage battery 20 is equal to or greater than the predetermined value, the range changing unit 130 according to the present embodiment sets the lower limit value TLL of the target range to a value that is less than the lower limit value PLL of the proper charge range.

When a process such as that described above is performed, opportunities for the storage battery 20 to be charged decrease. As a result, heat generation in the storage battery 20 that accompanies charging can be suppressed. Consequently, the temperature of the storage battery 20 can return to a normal temperature. Advancement of degradation resulting from the storage battery 20 being used while at a high temperature is prevented. Consequently, performance of the storage battery 20 can be achieved over a long period of time.

The magnitude of the regenerative electric power that is acquired often varies depending on conditions, such as traffic jams. Therefore, accurate predictions are often difficult to make. Therefore, when the control apparatus 10 proceeds to step S24 in FIG. 11, the control apparatus 10 may also perform a process to increase the upper limit value TUL of the target range in a manner similar to that at step S23. As a result, the charge amount with which the storage battery 20 is charged increases. Therefore, even when the prediction regarding the regenerative electric power is incorrect, the charge amount can be prevented from becoming insufficient.

In addition, the control apparatus 10 may perform the process to decrease the lower limit value TLL at step S24 only when power supply while the electric vehicle EV is stopped is expected. The control apparatus 10 may not perform the process when recovery of the charge amount through regenerative electric power is expected.

Furthermore, the control apparatus 10 may proceed from step S21 to step S24 only when the recovery of the charge amount is expected to occur before a predetermined period elapses from the current time or before the electric vehicle EV travels a predetermined distance. A reason for this is that the prediction regarding the regenerative electric power is highly likely to be incorrect, if the location at which the recovery of the charge amount is expected to occur is far from the current location.

Control that is performed when the storage battery 20 is charged using regenerative electric power will be described. When the storage battery 20 is charged using regenerative electric power, charging may be performed to a degree that the charge amount falls within the target range, in a manner similar to the charging that is performed in the power supply lane SLN. However, from the perspective of efficient use of energy, charging may be performed such that the charge amount exceeds the upper limit value TUL of the target range. In the latter case, the upper limit value of the charge amount when the storage battery 20 is charged with regenerative electric power may be set to a value that is greater than the upper limit value PUL of the proper charge range.

In addition, when the amount of regenerative electric power that is acquired can be predicted with relative accuracy, the upper limit value TUL of the target range when the electric vehicle EV is traveling in the power supply lane SLN may be set to a lower value to allow for the charging by the regenerative electric power.

The control performed by the charging control unit 120, that is, the control that is performed to set the charge amount of the storage battery 20 during charging within the target range will be described with reference to FIG. 13 to FIG. 15.

Figure 13:
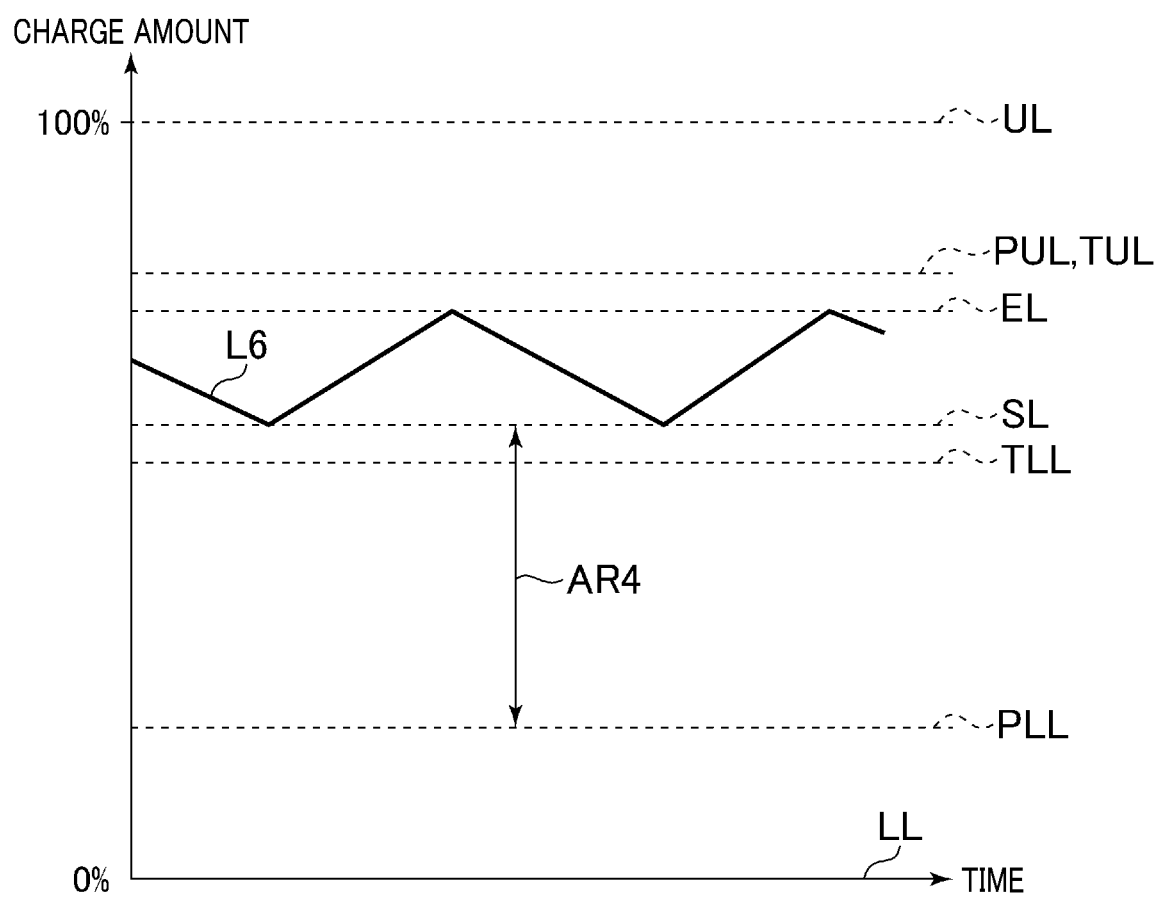
FIG. 13 is a graph of an example of the changes in the charge amount over time.

In the example shown in FIG. 13, the upper limit value TUL of the target range coincides with the upper limit value PUL of the proper charge range. A threshold EL shown in FIG. 13 is an upper limit at which charging of the storage battery 20 is stopped, in a manner similar to the threshold EL2 in FIG. 5. In addition, a threshold SL shown in FIG. 13 is a lower limit at which charging of the storage battery 20 is resumed, in a manner similar to the threshold SL2 in FIG. 5. The threshold EL is set to a value that is slightly less than the upper limit value TUL of the target range. The threshold SL is set to a value that is slightly greater than the lower limit value TLL of the target range.

In the example in FIG. 13, charging of the storage battery 20 is started when the charge amount decreases and reaches the threshold SL. Charging of the storage battery 20 is stopped when the charge amount increases and reaches the threshold EL. Therefore, as indicated by a line L6, the charge amount is kept within the target range while periodically changing between the threshold SL and the threshold EL.

An arrow AR4 in FIG. 13 shows a charge amount that is required for the electric vehicle EV to reach the next power supply location, that is, the required charge amount predicted at step S11 in FIG. 7. The threshold SL is set to a value that is obtained by the charge amount (arrow AR4) being added to the lower limit value PLL of the proper charge range. Therefore, the charge amount does not fall below the lower limit value PLL before the electric vehicle EV reaches the next power supply location after passing through the current power supply lane SLN.

Figure 14:
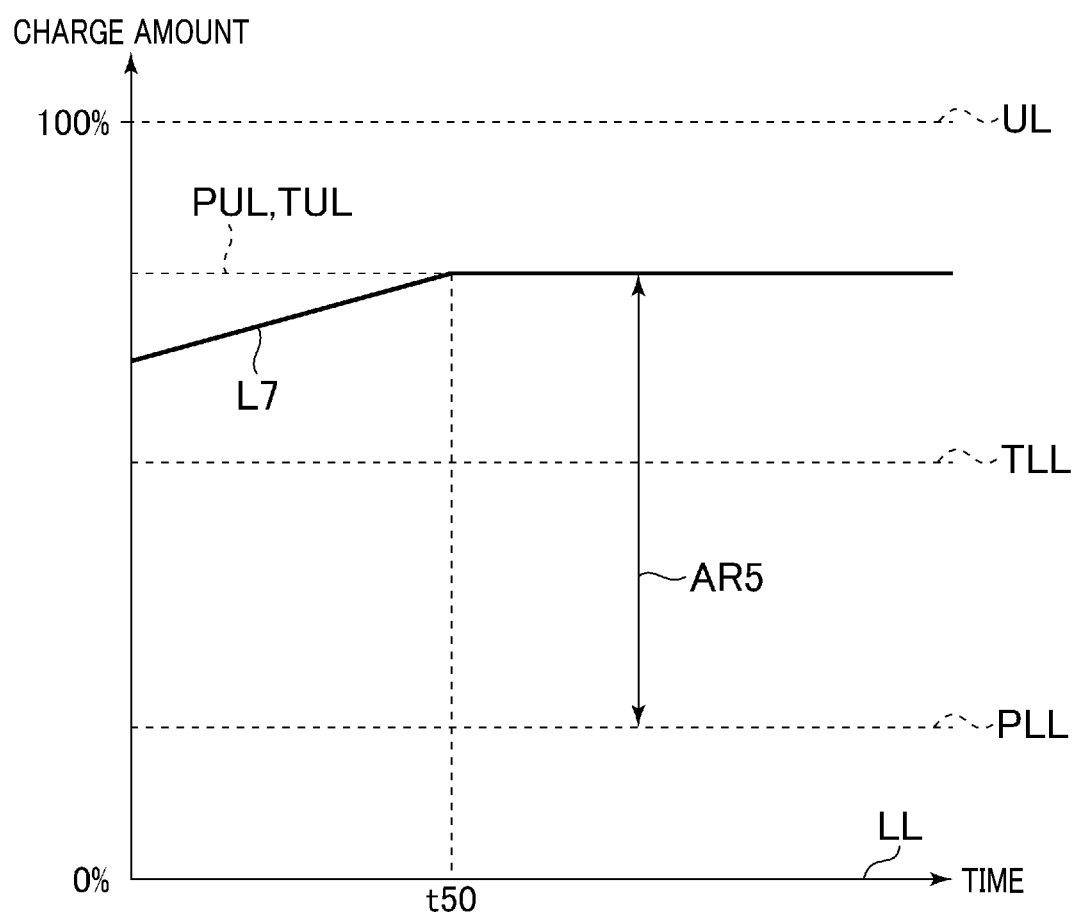
FIG. 14 is a graph of an example of the changes in the charge amount over time.

FIG. 14 will be described. In the example shown in FIG. 14 as well, the upper limit value TUL of the target range coincides with the upper limit value PUL of the proper charge range.

In the example in FIG. 14, as indicated by a line L7, the charging current is adjusted such that the charge amount remains at the upper limit value TUL after reaching the upper limit value TUL at time t50. Control such as this can also be considered to be control that is performed when the threshold EL and the threshold SL (not shown) are both set to the same value as the upper limit value TUL of the target range.

In this case, the charge amount is kept at substantially the same value as the upper limit value PUL. Therefore, a sufficient difference (arrow AR5 in FIG. 14) between the charge amount and the lower limit value PUL is ensured. Consequently, the charge amount falling below the lower limit value PLL before the electric vehicle EV reaches the next power supply location after passing through the current power supply lane SLN can be prevented with more certainty.

Figure 15:
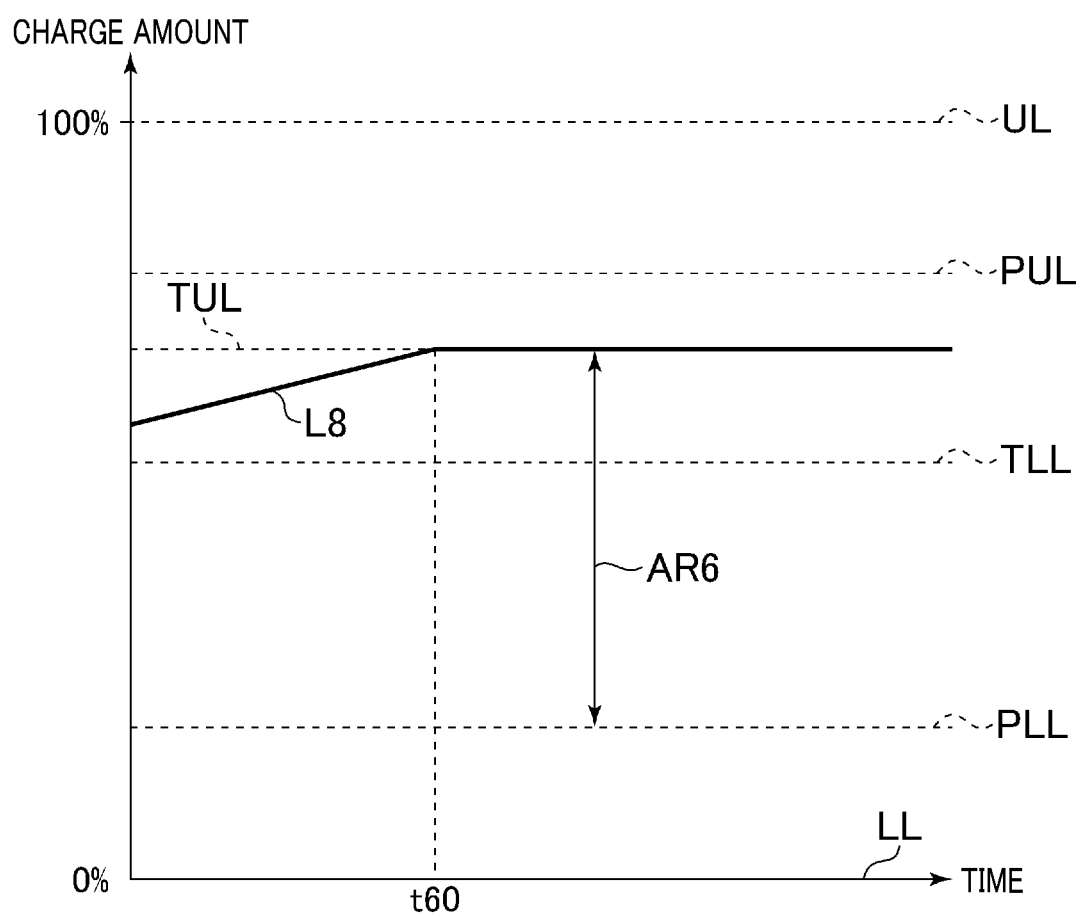
FIG. 15 is a graph of an example of the changes in the charge amount over time.

FIG. 15 will be described. In the example in FIG. 15, the upper limit value TUL of the target range is set to a value that is slightly less than the upper limit value PUL of the proper charge range.

In the example in FIG. 15, as indicated by a line L8, the charging current is adjusted such that the charge amount remains at the upper limit value TUL after reaching the upper limit value TUL at time t60. Control such as this can also be performed when the threshold EL and the threshold SL (not shown) are both set to the same value as the upper limit value TUL of the target range.

An arrow AR6 in FIG. 15 shows a charge amount that is required for the electric vehicle EV to reach the next power-supply location, that is, the required charge amount predicted at step S11 in FIG. 7. The upper limit value TUL in this example is set to a value that is obtained by the charge amount (arrow AR6) being added to the lower limit value PLL of the proper charge range. In this example, the charge amount is fixed and maintained in a state coinciding with the upper limit value TUL set as described above. Therefore, charging during traveling can be kept to a minimum. Consequently, power supply during stopping, which is highly efficient, can be preferentially performed over power supply during traveling, which is low in efficiency.

Second Embodiment

A second embodiment will be described. According to the present embodiment, only the mode of the processes performed by the control apparatus 10 differs from that according to the first embodiment. The second embodiment is identical to the first embodiment in other aspects.

Figure 16:
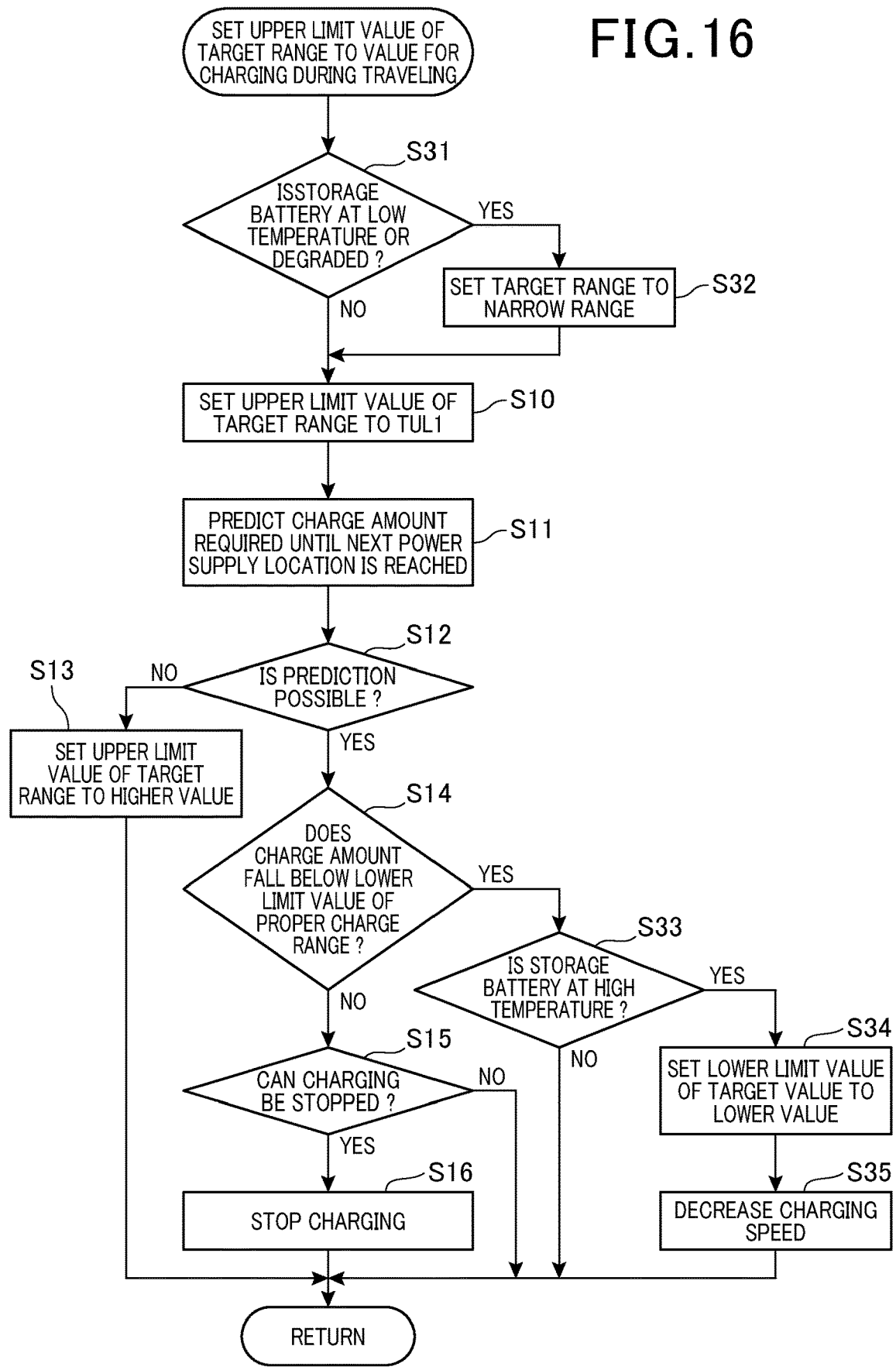
FIG. 16 is a flowchart of the flow of processes performed by the control apparatus according to a second embodiment.

The processes performed according to the present embodiment will be described with reference to the flowchart in FIG. 16. The processes shown in FIG. 16 show the flow of processes performed at step S08 in FIG. 6. The processes are that in which step S31 and the like are added to the processes according to the first embodiment shown in FIG. 7. Steps (such as step S10) that are identical to those in FIG. 7 are given the same reference numbers.

At an initial step S31, the control apparatus 10 determines whether the temperature of the storage battery 20 is less than a predetermined value, and whether degradation has occurred in the storage battery 20. The control apparatus 10 acquires the temperature of the storage battery 20 from a temperature sensor (not shown) attached to the storage battery 20. The above-described predetermined value is preset as a lower limit of an appropriate temperature range when the storage battery 20 is functioning in a normal manner. In addition, for example, the control apparatus 10 can determine whether degradation has occurred in the storage battery 20 based on usage time of the storage battery 20, the number of times the storage battery 20 is charged and discharged, the voltage during charging and discharge, and the like.

When determined that the temperature of the storage battery 20 is less than the predetermined value or degradation of the storage battery 20 has occurred, the control apparatus 10 proceeds to step S32. When determined otherwise, the control apparatus 10 proceeds to step S10.

At step S32, the control apparatus 10 performs a process to narrow the target range. Here, for example, the control apparatus 10 performs a process to narrow the range between the threshold EL and the threshold SL in FIG. 13 by decreasing the threshold EL and increasing the threshold SL. As a result, the variations in the charge amount such as that indicated by the line L6 are suppressed. Therefore, operation load placed on the storage battery 20 can be reduced. Consequently, advancement of degradation of the storage battery 20 can be suppressed.

After performing the process at step S32, the control apparatus 10 proceeds to step S10. Subsequent processes are identical to those described with reference to FIG. 7.

When predicted that the charge amount when the electric vehicle EV reaches the next power supply location will fall below the lower limit value PLL of the proper charge range at step S14, according to the present embodiment, the control apparatus 10 proceeds to step S33. At step S33, the control apparatus 10 determines whether the temperature of the storage battery 20 is equal to or greater than a predetermined value. This determination is identical to that performed at step S22 in FIG. 11. When determined that the temperature of the storage battery 20 is less than the predetermined value, that is, the storage battery 20 is at a normal temperature, the control apparatus 10 ends the series of processes shown in FIG. 16. When determined that the temperature of the storage battery 20 is equal to or greater than the predetermined value, the control apparatus 10 proceeds to step S34.

At step S34, the control apparatus 10 performs a process to set the lower limit value TLL of the target range to a lower value. Here, for example, as in the example shown in FIG. 17, the control apparatus 10 changes the lower limit value TLL that is a value (TLL1) greater than the lower limit value PLL of the proper charge range to a value (TLL2) that is less than the lower limit value PLL of the proper charge range.

Figure 17:
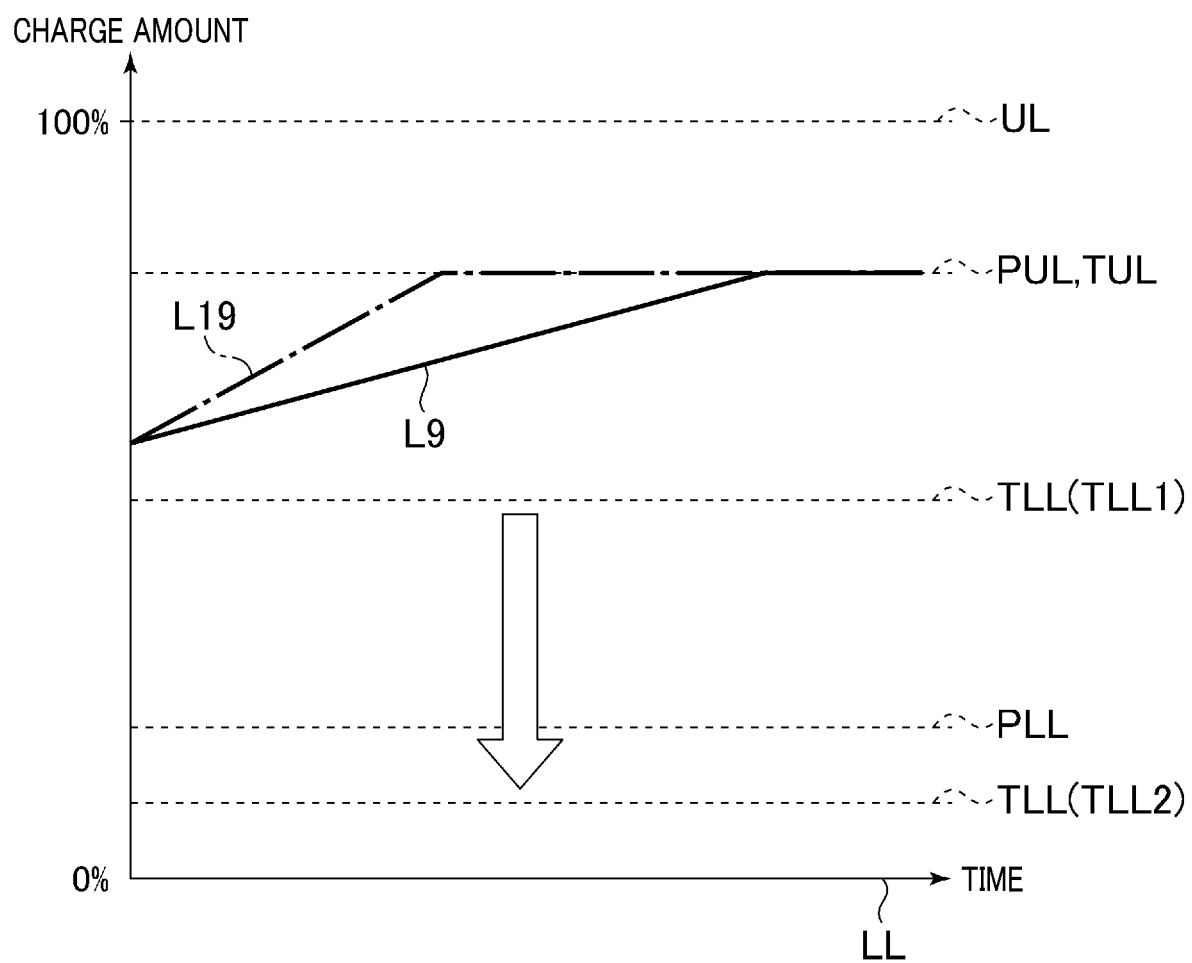
FIG. 17 is a graph of an example of the changes in the charge amount over time.

At step S35 following step S34, the control apparatus 10 performs a process to decrease the charging speed. A line L19 in FIG. 17 is a graph of the changes in the charge amount when the process at step S35 is not performed. A line L9 in FIG. 17 is a graph of the changes in the charge amount when the process at step S35 is performed. According to the present embodiment, the control apparatus 10 decreases the charging speed (that is, the charging current) such that the gradient of the charge amount decreases so as to be similar to the line L9.

As a result, heat generation in the storage battery 20 that accompanies charging can be suppressed. Consequently, the temperature of the storage battery 20 can return to a normal temperature. Advancement of degradation resulting from the storage battery 20 being used while at a high temperature is prevented. Consequently, performance of the storage battery 20 can be achieved over a long period of time.

In addition, opportunities for the storage battery 20 to be charged decrease in accompaniment with the lower limit value TLL of the target range being decreased. Consequently, heat generation in the storage battery 20 that accompanies charging can be further suppressed.

As described above, the charging control unit 120 according to the present embodiment changes the charging speed at which the storage battery 20 is charged based on the state of the electric vehicle EV. As the "state of the electric vehicle EV," other states may be used in addition to the temperature and the degree of degradation of the storage battery 20, described above. For example, the storage battery 20 may be charged at a reduced charging speed when the power supply lane SLN in which the electric vehicle EV is currently traveling is relatively long and charging can be performed over a long period of time.

For example, to protect the storage battery 20, the control apparatus 10 may perform a process to decrease the traveling speed of the electric vehicle EV, in addition to the processes at step S34 and step S35.

When the storage battery 20 is at a low temperature such as when the control apparatus 10 proceeds to step S32, the temperature of the storage battery 20 may be increased by the charging speed being increased.

The embodiments are described above with reference to specific examples. However, the present disclosure is not limited to these specific examples. Design modifications in these specific examples made as appropriate by a person skilled in the art are also included in the scope of the present disclosure, as long as the characteristics of the present disclosure are included. Elements, and arrangements, conditions, shapes, and the like of these elements provided in the above-described specific examples are not limited thereto, and may be modified as appropriate. Combinations of the elements included in the above-described specific examples may be changed as appropriate, as long as technical contradictions do not occur.

What is claimed is:

1. A control apparatus for an electric vehicle that is configured to charge a storage battery with electric power that is supplied while traveling in a power supply lane that is a travelling road on which contactless power supply is performed, the control apparatus comprising:
    a charging control unit that:
        controls charging of the storage battery such that a charge amount of the storage battery falls within a target range that is a set range; and
        in response to a temperature of the storage battery being greater than or equal to a predetermined value, decreases a charging speed and performs a process to set a lower limit value of the target range to a lower value.

2. The control apparatus according to claim 1, wherein:
    the charging control unit increases the charging speed, in response to the temperature of the storage battery being less than the predetermined value.

3. The control apparatus according to claim 1, wherein:
    the charging control unit narrows the target range, in response to the temperature of the storage battery being less than the predetermined value or in response to degradation having occurred in the storage battery.

4. The control apparatus according to claim 1, wherein:
    the charging control unit decreases a traveling speed of the electric vehicle, in response to the temperature of the storage battery being greater than or equal to the predetermined value.

5. A control system for an electric vehicle that is configured to charge a storage battery with electric power that is supplied while traveling in a power supply lane that is a travelling road on which contactless power supply is performed, the control system comprising:
    a processor;
    a non-transitory computer-readable storage medium; and
    a set of computer-readable instructions stored in the non-transitory computer-readable storage medium that, when read and executed by the processor, cause the processor to implement:
        controlling charging of the storage battery such that a charge amount of the storage battery falls within a target range that is a set range; and
        in response to a temperature of the storage battery being greater than or equal to a predetermined value, decreasing a charging speed and performing a process to set a lower limit value of the target range to a lower value.

6. A control method for an electric vehicle that is configured to charge a storage battery with electric power that is supplied while traveling in a power supply lane that is a travelling road on which contactless power supply is performed, the control method comprising:
    controlling charging of the storage battery such that a charge amount of the storage battery falls within a target range that is a set range; and
    in response to a temperature of the storage battery being greater than or equal to a predetermined value, decreasing a charging speed and performing a process to set a lower limit value of the target range to a lower value.

7. A control apparatus for an electric vehicle that is configured to charge a storage battery with electric power that is supplied while travelling in a power supply lane that is a travelling road on which contactless power supply is performed, the control apparatus comprising:
    a charging control unit that:
        controls charging of the storage battery such that a charge amount of the storage battery falls within a target range that is a set range; and
        in response to a temperature of the storage battery being less than a predetermined value, increases a charging speed and narrows the target range at least by increasing a lower limit value at which charging of the storage battery is started.

* * * * *